United States Patent [19]

Goth et al.

[11] 4,400,865

[45] Aug. 30, 1983

[54] SELF-ALIGNED METAL PROCESS FOR INTEGRATED CIRCUIT METALLIZATION

[75] Inventors: George R. Goth, Poughkeepsie; Ingrid E. Magdo, Hopewell Junction; Shashi D. Malaviya, Fishkill, all of N.Y.

[73] Assignee: International Business Machines Corporation, Armonk, N.Y.

[21] Appl. No.: 167,184

[22] Filed: Jul. 8, 1980

[51] Int. Cl.³ .................. H01L 21/22; H01L 21/28
[52] U.S. Cl. .................... 29/571; 29/577 C; 29/590; 29/578; 148/187; 156/643; 156/656
[58] Field of Search .............. 29/571, 577 C, 578, 29/590; 148/187; 156/643, 656

[56] References Cited

U.S. PATENT DOCUMENTS

| | | | |
|---|---|---|---|
| 3,750,268 | 8/1973 | Wang | 29/571 |
| 3,902,926 | 9/1975 | Perloff et al. | 148/1.5 |
| 3,984,822 | 10/1976 | Simko et al. | 29/571 X |
| 4,038,110 | 7/1977 | Feng | 357/50 X |
| 4,083,098 | 4/1978 | Nicholas | 29/578 |
| 4,173,768 | 11/1979 | Denlinger et al. | 357/65 X |
| 4,209,350 | 6/1980 | Ho et al. | 148/1.5 X |
| 4,318,751 | 3/1982 | Horng | 357/50 X |
| 4,319,395 | 3/1982 | Lund et al. | 29/591 |
| 4,322,883 | 4/1982 | Abbas et al. | 148/187 X |
| 4,359,816 | 11/1982 | Abbas et al. | 148/187 X |

FOREIGN PATENT DOCUMENTS 2003660 3/1979 United Kingdom .

OTHER PUBLICATIONS

Pogge, I.B.M. T.D.B., vol. 19, No. 6, Nov. 1976, pp. 2057-2058.
Abbas et al., I.B.M. T.D.B., vol. 20, No. 4, Sep. 1977, pp. 1376-1378.
Critchlow, Computer, vol. 9, No. 2, Feb. 1976, pp. 31-37.
Jackson et al., Semiconductor International, Mar. 1980, pp. 77-83.

Primary Examiner—G. Ozaki
Attorney, Agent, or Firm—George O. Saile

[57] ABSTRACT

A self-aligned metal process is decribed which achieves self-aligned metal to silicon contacts and sub-micron contact-to-contact and metal-to-metal spacing. The insulation between the contacts and the metal is a pattern of dielectric material having a thickness dimension in the order of a micron or less. The metal and dielectric structure is substantially planar. The method for forming this structure involves providing a silicon body and then forming a first insulating layer on a major surface of the silicon body. A layer of polycrystalline silicon is formed thereover. Openings are made in the polycrystalline silicon layer by reactive ion etching which results in the structure having substantially horizontal surfaces and substantially vertical surfaces. A second insulating layer is then formed on both the substantially horizontal surfaces and substantially vertical surfaces. Reactive ion etching of this second insulating layer substantially removes the horizontal layers and provides a narrow dimensioned dielectric pattern of regions on the major surface of the silicon body. The remaining polycrystalline silicon layer is then removed by etching to leave the narrow dimensioned regions on the major surface of the silicon body. A conductive layer is blanket deposited over the narrow dimensioned regions and areas in between. The surface is planarized leaving the structure of metal filling the regions between the pattern of dielectric material.

43 Claims, 46 Drawing Figures

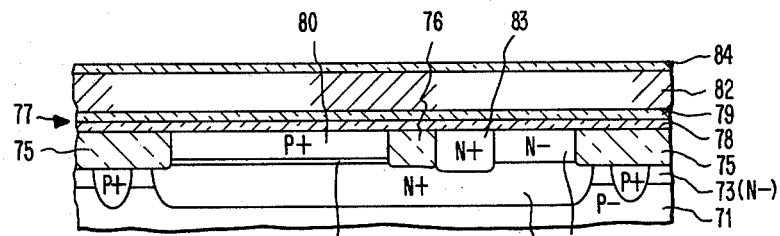
FIG. 6
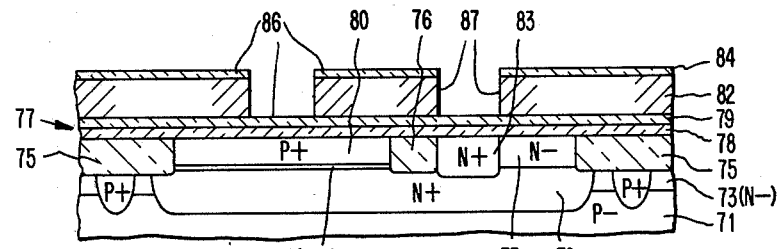
FIG. 7A
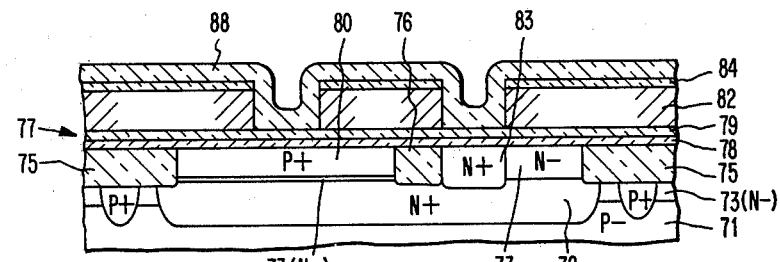
FIG. 7B
FIG. 7C

SELF-ALIGNED METAL PROCESS FOR INTEGRATED CIRCUIT METALLIZATION

DESCRIPTION

TECHNICAL FIELD

The invention relates to methods and resulting structures for manufacturing integrated semiconductor devices and, more particularly, to a self-aligned metal process which achieves self-aligned metal-to-silicon contacts and sub-micron contact-to-contact and metal-to-metal spacing wherein the insulation between the contacts is a pattern of dielectric material having a thickness dimension in the order of a micron or less.

CROSS REFERENCES TO RELATED PATENT APPLICATIONS (1) Patent application Ser. No. 167,253 filed like date, now U.S. Pat. No. 4,359,816, entitled "Self-Aligned Metal Process for Field Effect Transistor Integrated Circuits" by S. Abbas and I. Magdo.

(2) Patent application Ser. No. 167,173 filed like date, now U.S. Pat. No. 4,322,883, entitled "Self-Aligned Metal Process for Integrated Injection Logic Integrated Circuits" by S. Abbas and I. Magdo.

(3) Patent application Ser. No. 167,172 filed like date entitled "Self-Aligned Metal Process for Field Effect Transistor Integrated Circuits Using Polycrystalline Silicon Gate Electrodes" by C. G. Jambotkar.

BACKGROUND ART

Semiconductor integrated circuits have substantially increased in density in the past decade. However, there is a increasing demand for greater complexities, higher switching speeds and smaller devices for new applications, such as microprocessors and minicomputers. A very active area in the semiconductor fabrication technology has been the generation and application of fine lines in the lithographic technology. Light had been used almost exclusively until the recent past in the lithographic process. However, optical resolution limits make further advances in line widths much more difficult. The most important and versatile among the technologies for the furture reduction in line widths are electron beam and X-ray exposure processes. The lithography problem and their possible solutions are discussed in greater detail by D. L. Critchlow in the publication entitled "High Speed MOSFET Circuits Using Advanced Lithography", published in the *Computer*, Vol. 9, No. 2, February 1976, pp. 31 through 37. In that publication the substantial equipment costs and complexities of X-ray and electron beam lithography are described.

There have been alternative efforts to obtain narrow line widths in the range of one micrometer or less by extending standard photolithography techniques and avoiding the need for the more expensive and complex techniques, such as electron beam or X-ray lithography. One such technique is described by H. B. Pogge in IBM Technical Disclosure Bulletin, November 1976, Vol. 19, No. 6, pp. 2057 and 2058, entitled "Narrow Line-Width Masking Method". This method involves the use of a porous silicon followed by oxidation of porous silicon. Another technique is described by S. A. Abbas, et al, IBM Technical Disclosure Bulletin, Vol. 20, No. 4, September 1977, pp. 1376 through 1378. This TDB describes the use of polycrystalline silicon masking layers which are made into masks by first using an intermediate mask of oxidation blocking material, such as silicon nitride in the formation of the polycrystalline silicon. Line dimensions below about two micrometers may be obtained by this technique. T. N. Jackson, et al, described "A Novel Submicron Fabrication Technique" in the March 1980 publication *Semiconductor International*, pp. 77 through 83, a method for producing submicron line widths and devices which do not require electron beam lithography but used a selective edge plating technique. The U.K. Pat. No. 2,003,660 published Mar. 14, 1979 describes a method for depositing an area of metal, for example, metal on a substrate and forming narrow metal stripes thereby by using a unidirectional plasma etching technique. These above techniques do show ways of forming narrow lines on substrates but lack an overall solution for their successful use in the manufacture of semiconductor devices, because it is unclear how they will be used to contact actual device elements within the semiconductor substrate in an accurate and effective manner. Further, there are problems of planarity of the first level metallurgy and adequate conductivity of the metallurgy at that level. K. H. Nicholas, U.S. Pat. No. 4,083,098 describes a method of making a plurality of closely spaced, but air isolated, conductive layers on an insulated substrate. Although he very broadly suggests the possibility of forming ohmic contacts to his semiconductor body at column 3 lines 4–9; column 11, lines 47–68; column 12, lines 1–22; he otherwise exclusively describes charge coupled device type structures.

The patent application of H. B. Pogge, Ser. No. 957,604 filed Nov. 3, 1978, now U.S. Pat. No. 4,256,514, entitled "Method for Forming a Narrow Dimensioned Region on A Body" and the patent application of J. Riseman Ser. No. 957,606 filed Nov. 3, 1978, now U.S. Pat. No. 4,234,362, entilted "Method for Forming An Insulator Between Layers of Conductive Material" describe a technique for forming narrow dimensioned, for example, submicron regions on a semiconductor body that involves forming on the silicon body regions having substantially horizontal surfaces and substantially vertical surfaces. A layer of the very narrow dimension is formed both on the subtantially horizontal and subtantially vertical surfaces. Reactive ion etching is applied to the layer to substantially remove the horizontal layer while leaving the vertical layer substantially intact. The vertical layer dimension is adjusted depending upon the original thickness of the layer applied. The patents more importantly describe techniques for using this narrowed dimensioned region in a semiconductor device fabrication process for various types of integrated circuit structures.

A major problem in very dense integrated circuits is the electrical contacts to the various elements and devices in the semiconductor integrated circuits. It is often necessary to have multilevels of metallurgy in the order of 2, 3, 4 or more levels of metallurgy to contact the large number of devices within the integrated circuits. These levels of metallurgy must be isolated from one another. This multilayer structure has the problems of planarity which can adversely affect the lithography process steps and result in defects in the structures through incomplete exposure of the lithographic layers. A further problem involves the conductivity of the metallurgy at the various levels. In recent times, solutions to these problems have taken the direction of the use of highly doped polycrystalline silicon as conductive layers such as shown in R. C. Wang, U.S. Pat. No. 3,750,268, issued Aug. 7, 1973 and R. T. Simko, et al, U.S. Pat. No. 3,984,822, issued Oct. 5, 1976. However, as the density of devices has increased, there still remains problems involving isolation between devices, conductivity particularly at the first level of metallurgy contacting the semiconductor devices, and alignment of the the levels of metallurgy to the device elements in the semiconductor integrated circuit.

SUMMARY OF THE PRESENT INVENTION

In accordance with the present invention, a self-aligned metal process is described which achieves self-aligned metal silicon contacts and micron-to-submicron contact-to-contact and metal-to-metal spacing by use of a pattern of dielectric material having a thickness of the order of a micron or less. The process results in a substantially planar structure. The first level metallurgy can be any desired metal such as aluminum, aluminum-copper, polycrystalline silicon or the like.

The method for forming integrated circuits having a pattern of narrow dimensioned dielectric regions on a monocrystalline semiconductor, preferably silicon, body involves providing the silicon body and forming a first insulating layer on a major surface of the body. A polycrystalline silicon layer is then formed on the first insulating layer. Openings in the polycrystalline layer are made using directional reactive ion etching which results in a structure having substantially horizontal surfaces and substantially vertically surfaces. A second insulating layer is then deposited on both said substantially horizontal surfaces and said substantially vertical surfaces. The thickness of the second insulator layer is the desired thickness of the narrowed dimensioned dielectric regions to ultimately be formed on the semiconductor, or preferably silicon, body. The structure is placed in a reactive ion etching ambient where the second insulating layer is substantially removed from the horizontal surfaces and has no significant effect on the insulating layer on the vertical regions of the polycrystalline silicon. The remaining polycrystalline silicon regions are then removed by etching to leave the self-standing narrow dimensioned dielectric regions on the silicon body surface. A conductive layer of one or more wide variety of possible materials is now blanket deposited upon the narrow dimensioned regions and on the silicon body. Where the conductive layer is formed upon bare silicon, ohmic or Schottky barrier contacts can be formed thereto. A plastic material, such as a photoresist or polyimide, is deposited over this conductive layer to planarize the surface thereof. The structure is then placed in a reactive ion etching ambient where the conductive layer is preferably uniformly etched together with the plastic layer until the tops of the narrow dimensioned regions are reached. Alternatively, the plastic layer is removed down to where the conductive layer peaks appear, the exposed conductive layer is removed down to where the narrow dielectric regions appear, and the remaining plastic layer is removed. The remaining plastic material is then removed to thereby form the substantially planar conductive layer with narrow dimensioned dielectric isolation separating portions of the conductive layer from other portions of the conductive layer.

The method can be used to form a variety of products which include bipolar transistors, field effect transistors, resistors and Schottky barrier diodes, etc. These structures are formed by appropriate modifications of the method described in the preceding paragraph to form suitable PN junctions, gate dielectric and electrode structures, PN contact regions, together with openings to the semiconductor body which have these elements formed therein. The conductive layer with the narrow dimensioned dielectric pattern to electrically isolate the various regions of the conductive layer are formed according to the method described above. Logic and memory integrated circuits may be formed according to the method to provide the beneficial results of high density with suitable conductivity of the metallurgy layers.

A high density integrated circuit structure may be manufactured according to the present technique wherein a silicon body having electrical devices formed therein with regions of the devices extending to the major surface of the silicon body. Isolation regions of silicon dioxide have been formed in the silicon body for isolating the electrical devices from one another. A pattern of narrow dimensioned dielectric regions are located on the surface of the major surface of the silicon body. Electrical contacts to elements of the electrical devices fill the spaces between the narrow dimensioned dielectric regions. The contacts to the electrical devices are self-aligned to the narrow dimensioned regions. The structure is substantially planar. The particular electrical devices utilized may be one or several of a variety of known devices which are, for example, bipolar transistors, field effect transistors, resistors and Schottky barrier diodes. The narrowest width dimension of the narrow dimensioned region may be a submicron or submicrometer. The structure may be formed without the use of electron beam or X-ray technologies.

BRIEF DESCRIPTION OF THE DRAWINGS

The drawings show the following:

FIG. 6 schematically illustrates a field effect transistor embodiment of the present invention.

FIGS. 7A through 7G illustrate another method embodiment for manufacturing device structures according to the present invention.

DISCLOSURE OF THE INVENTION

Figure 1:
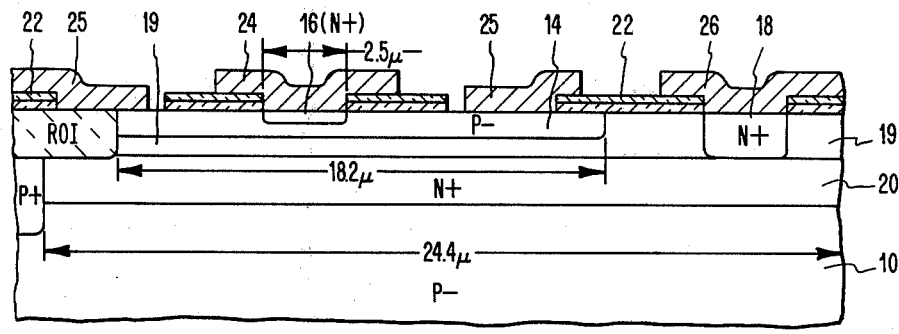
FIGS. 1 and 2 schematically illustrate known prior art, bipolar transistor structures.
Figure 2:
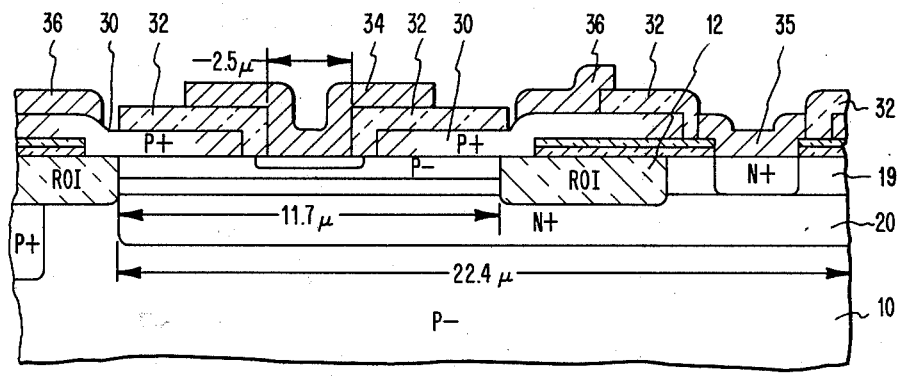
Figure 3:
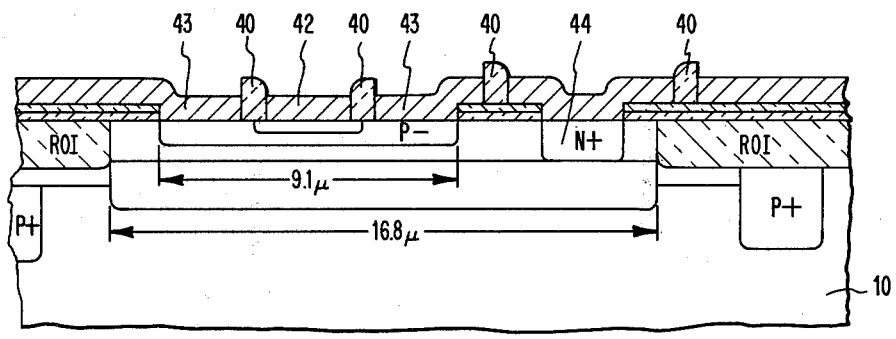
FIG. 3 schematically illustrates one embodiment of a bipolar transistor structure according to the present invention.

Referring now more particularly to FIGS. 1, 2 and 3 wherein two prior art structures shown in FIGS. 1 and 2 can be compared with a similar structure in the self-aligned metal technology of the present invention. The FIGURES show the bipolar transistor structure wherein a 2.5 micron or micrometer minimum line width is utilized. Each of the bipolar transistors shown in FIGS. 1, 2 and 3 are NPN trnsistors, and are formed on a P-substrate 10. Like numbers indicate like structures in each of these figures.

FIG. 1 shows a prior art widely used NPN bipolar device that uses dielectric isolation and can be better understood by reference to the Peltzer U.S. Pat. No. 3,648,125 and I. Magdo, et al, patent application Ser. No. 150,609, filed June 7, 1971. Briefly, the bipolar transistor device is dielectrically isolated by recess oxide insulation regions, ROI. The ROI isolates regions of monocrystalline silicon containing bipolar transistors from other like regions. The base region 14 contains emitter region 16. A N+ collector reach-through region 18 contacts the N+ epitaxial layer 20 which is located on the P- substrate 10. Surface insulator regions 22 are present to isolate the emitter electrode 24, base electrodes 25 and collector electrode 26 from surface regions not desired to be contacted.

The FIG. 2 prior art structure which is known as the polycrystalline base type structure may be more fully understood with reference to the T. H. Ning, et al, U.S. Pat. No. 4,157,269 and the N. G. Anantha, et al U.S. Pat. No. 4,160,991. Briefly the structure includes recess oxide isolation regions, ROI, which isolate surface monocrystalline silicon regions from one another and which isolate the base-emitter region from the reach-through region. The FIG. 2 structure is the same as the FIG. 1 device, except that the ROI region 12 isolates the base-emitter region from the N+ reach-through area of the epitaxial layer 19, and the surface contacts to elements of the NPN transistor are different. Rather than the metal contacts 22, 25, 26, as in the FIG. 1 device, there are polycrystalline silicon contacts 30 to the base region. A silicon dioxide layer 32 is formed over the polysilicon contacts 30. Openings are made in the silicon dioxide layer 32 to contact the emitter and collector reach-through elements of the transistor and to contact the polycrystalline silicon base contact 30. Contact 34 is made to the emitter, contact 35 to the collector reach-through, contact 36 to the polycrystalline silicon base by a single deposition and lithographic steps.

The FIG. 3 bipolar transistor structure which compares to the FIG. 1 and FIG. 2, and has like structures as indicated by like numbers, except for the surface metallurgy and isolation regions. A pattern of narrow dimensioned dielectric regions 40 are located on the surface of the silicon body. Electrical contacts to the emitter, base and collector reach-through elements of the bipolar transistor fill the spaces between the narrow dimensioned dielectric regions. The emitter contact is 42, the base contact is 43 and the collector reach-through contact is 44.

The devices may be compared since the same minimum 2.5 micron line width was used to produce each of the structures. The size of the devices is indicated in the figures in microns.

Figure 15A:
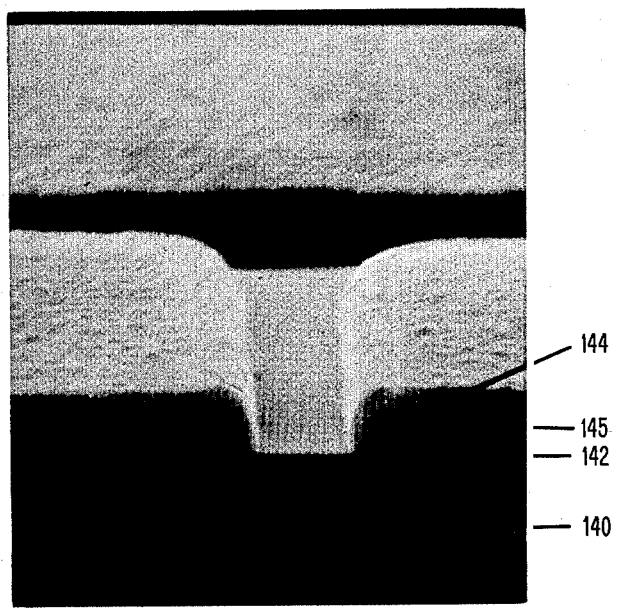
FIGS. 15A through 15F are enlarged photographic illustrations of method steps actually used in forming structures according to an Example of the present invention.
Figure 15B:
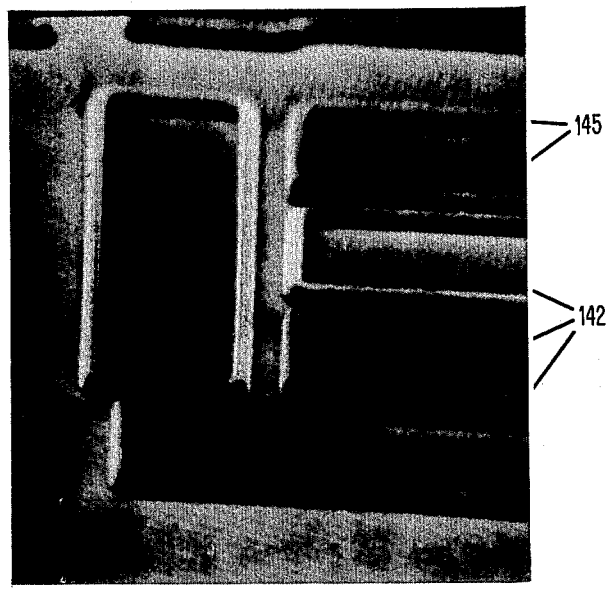
Figure 15C:
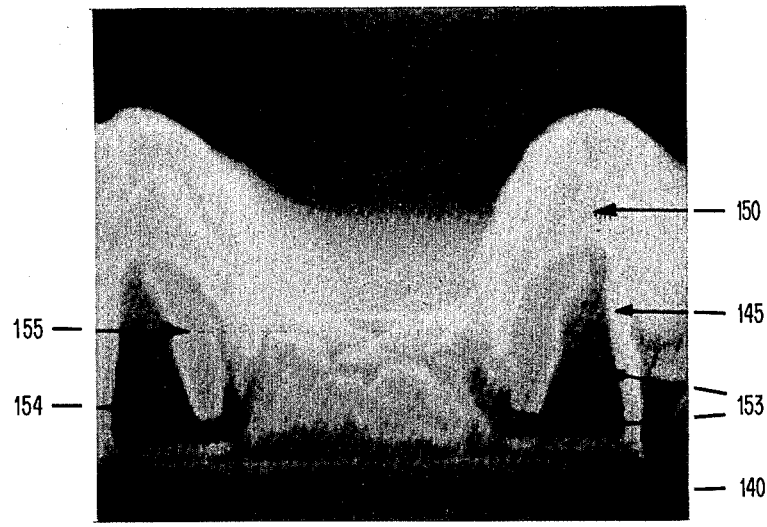
Figure 15D:
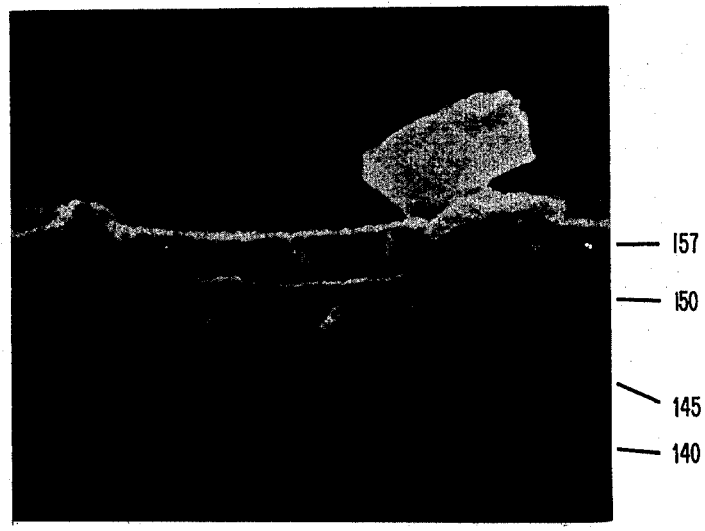
Figure 15E:
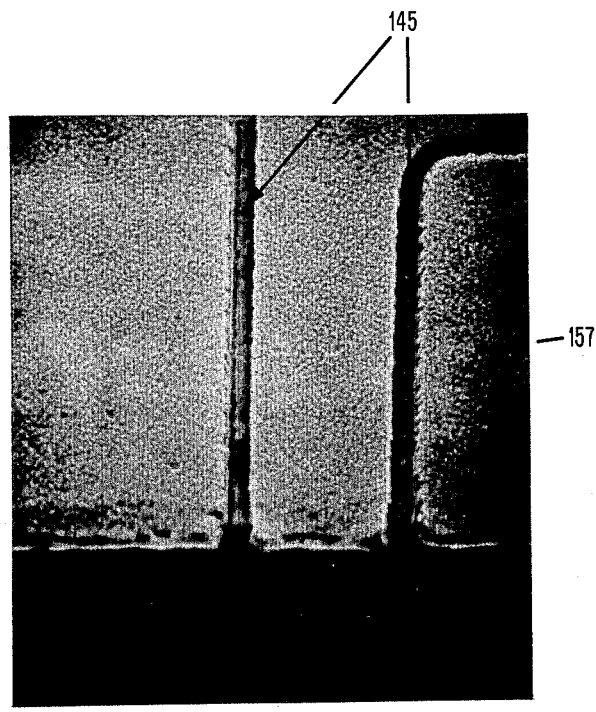
Figure 15F:
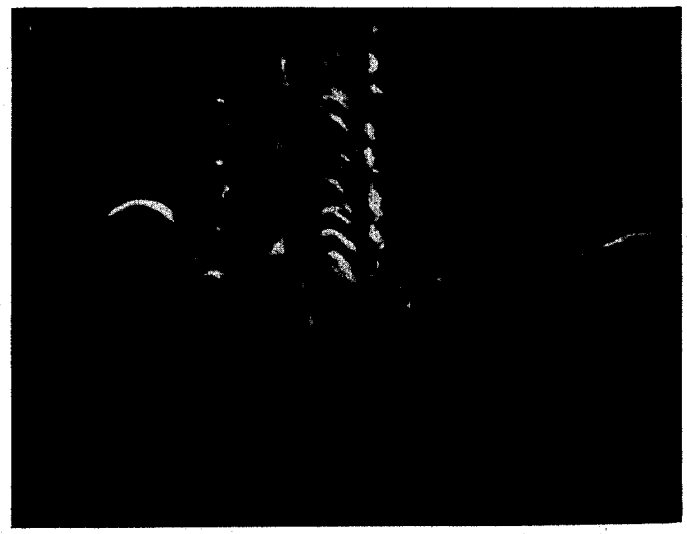
Figure 16:
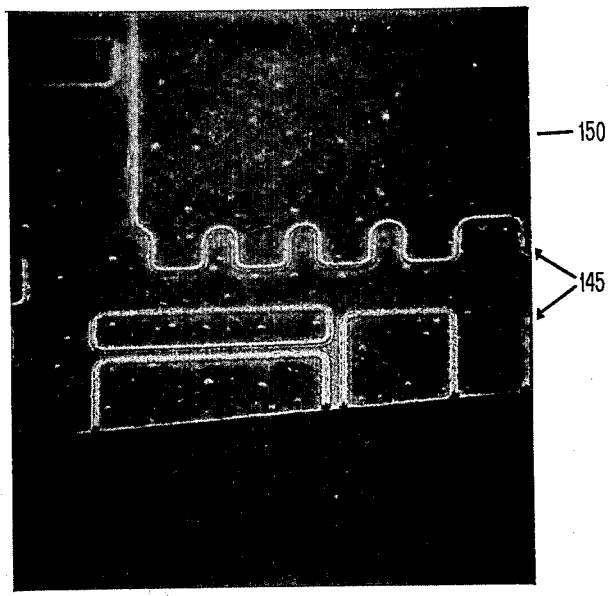
FIG. 16 is a test pattern structure made according to the process of the FIGS. 15A through 15F.

It will be noted that the length of the subcollector reduces from 24.4 micrometers in FIG. 1 to 22.4 in FIG. 2 and 16.8 in FIG. 3. Also, length of the base window reduces from 18.2 micrometers in FIG. 1 to 11.7 micrometers in FIG. 2 and 9.1 micrometers in FIG. 3. The table below summarizes the key parameters of the devices shown in FIGS. 1, 2 and 3.

Figure 4:
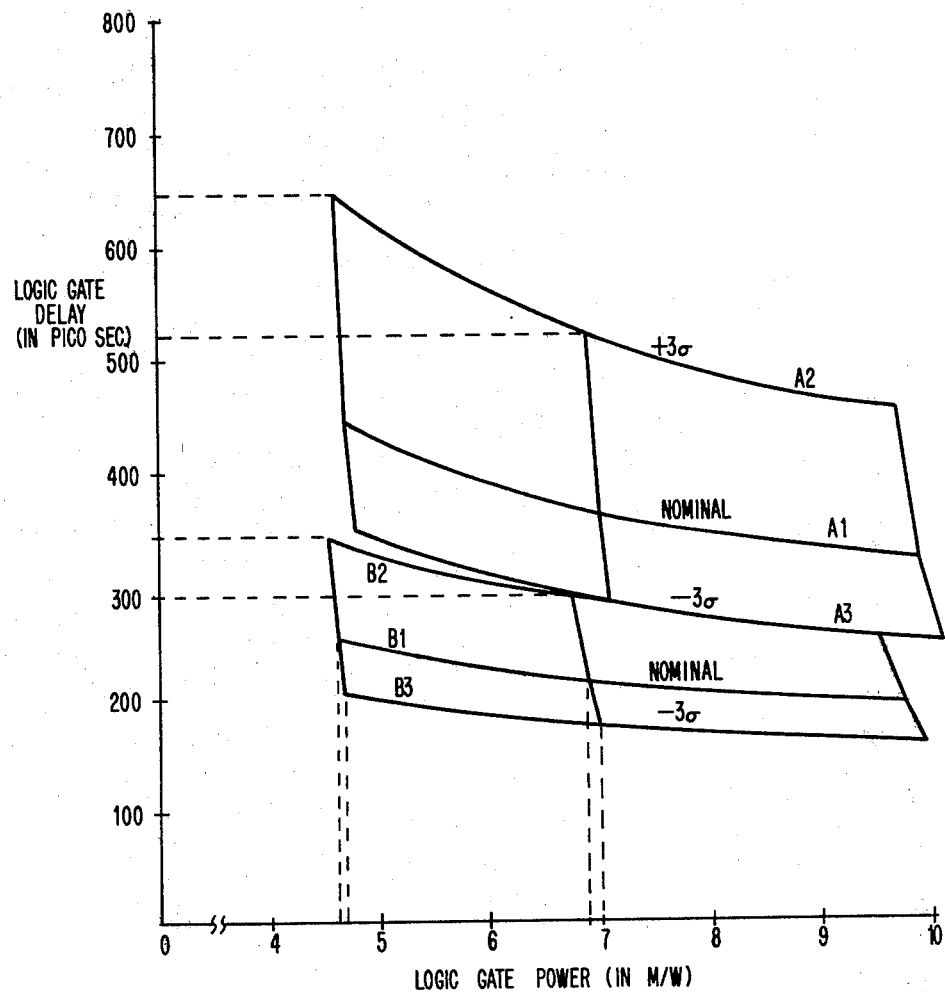
FIG. 4 illustrates a comparison of a current switch emitter follower logic gate function between the prior art structures shown in FIGS. 1 and 2 and the FIG. 3 embodiment.

| Parameter | FIG. 1 | FIG. 2 | FIG. 3 |
| --- | --- | --- | --- |
| $C_{CB}$ @ 0 volts (pf) | 0.074 | 0.045 | 0.029 |
| $C_{CS}$ @ 0 volts (pf) | 0.017 | 0.017 | 0.014 |
| $R_B$ @ 1 $\mu$amps (ohms) | 397 | 283 | 258 | where $C_{CB}$ is collector to base capacitance, $C_{CS}$ is collector to substrate (isolation) capacitance, and $R_B$ is base resistance. The effect of the above improvements in device characteristics on a high speed circuit such as a loaded current switch emitter follower logic gate (fan in=3, fan out=3), is shown in FIG. 4 where the logic gate delay (in pico seconds) is plotted as a function of the logic gate power (in milliwatts). Curves A1, A2 and A3 show the delays for the nominal, $+3\sigma$ and $-3\sigma$ cases for devices fabricated according to the prior art shown in FIG. 1 whereas curves B1, B2 and B3 show the corresponding delays for devices fabricated according to the present invention, as shown in FIG. 3.

The nominal delay corresponds to all power supplies held at their nominal values, all mask images in the silicon at their nominal image sizes, all process parameters (junction profiles, etc.) at their design values, and the circuit operating at 55° C. The three sigma ($\pm 3\sigma$) limits A2, A3, B2 and B3 correspond to the power supply and temperature deviated in their operating limits and the process parameters deviated statistically to their three sigma limits.

As the curves clearly show, the structure of the present invention results in substantial improvement in the performance, especially in the $3\sigma$ worst case to, which computers and other electronic machines are designed. For example, the worst case delay improves from 524 psec @ 7.0 milliwatts for the prior art to 362 psec @ 4.7 milliwatts for a similar logic gate using the present invention. The delay reduces to 303 psec if the power is held constant at 7.0 milliwatts.

Figure 5A:
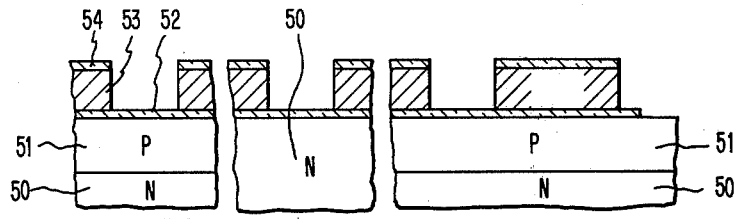
FIGS. 5A through 5F illustrate one method embodiment for forming device structures of the present invention.
Figure 5B:
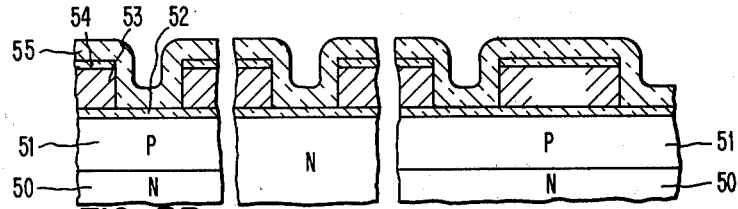
Figure 5C:
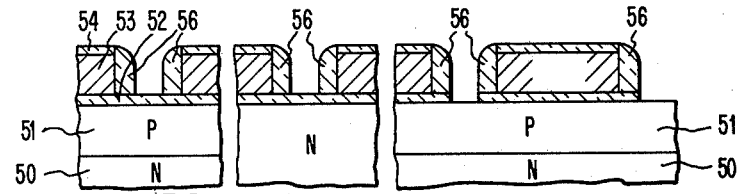
Figure 5D:
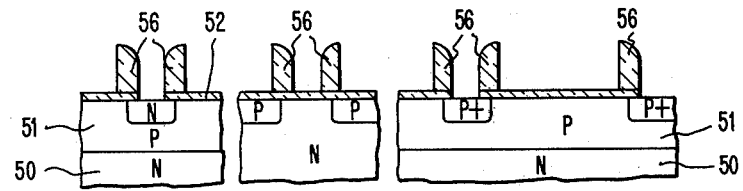

Referring now to FIGS. 5A through 5F for a description of one method embodiment for manufacturing structures according to the present invention. A silicon body 50 is provided. The body 50 is shown as N type in FIG. 5A wherein it can either be an N type epitaxial layer on a suitable monocrystalline silicon substrate or be an N type substrate itself. The structure has been broken into three parts to show the flexibility of the process for forming a variety of semiconductor devices having self-aligned metal to silicon contacts and submicron contact-to-contact and metal-to-metal spacing. A P region 51 may be formed according to diffusion, ion implantation or epitaxial growth techniques. A first insulating layer 52 is formed on a major surface of the body. This insulating layer can be any one of several conventional insulators or combinations of insulators such as silicon dioxide, silicon nitride, aluminum trioxide, etc. A polycrystalline silicon layer 53 is formed on the first insulating layer. The structure is placed in preferably a chemical vapor deposition ambient to form silicon nitride layer 54 on the surface of the polycrystalline silicon. Other layers such as chemical vapor deposited silicon dioxide, etc. can alternatively be formed upon the layer 53. Standard photolithography and etching techniques may be utilized to form openings in this silicon nitride layer 54 over the desired areas. Openings are formed in the polycrystalline layer 53 by reactive ion etching which results in a structure having substantially horizontal surfaces and substantially vertical surfaces as shown in the FIG. 5A. The conditions of reactive ion etching for layer 53 requires an etch ratio of about 10:1 silicon nitride layer 55 to polycrystalline silicon layer 53. FIG. 5B shows the result of the formation of the conformal layer 55 on both the substantially horizontal surfaces and the substantially vertical surfaces. The FIG. 5B structure is placed into a suitable reactive ion etching ambient for the material of layer 55. For example, where the layer 55 is silicon dioxide, in etching silicon dioxide the conditions are such that an etch ratio of about 10 to 1 silicon dioxide to silicon is desirable. Overetching is needed to be sure the silicon dioxide is removed and/or an etch stop indicator is used. The reactive ion etching process substantially removes the horizontal portion of layer 55 and provides the narrow dimensioned dielectric region 55 on the vertical surfaces of the silicon body which is shown in the FIG. 5C. The layer 55 is typically formed by chemical vapor deposition. This conformal layer may be one of several insulating materials such as silicon dioxide, silicon nitride, aluminum oxide and combinations of these materials. Alternatively, the conformal layer can be polycrystalline silicon which can later have its surfaces formed into an insulating layer as will be described below. The FIG. 5C structure is then subjected to a polycrystalline silicon etchant, which is preferably ethylenediamine, pyrocatechol and water, to remove all polycrystalline silicon from the structure to produce the FIG. 5D device. Now the pattern of narrow dimensioned dielectric regions 56 are established on the integrated circuit structure. Doping to form, for example, the N region and P+ region in FIG. 5D is executed prior to the etching of the polycrystalline silicon to maintain the self-alignment feature. At this point diffusions or ion implantations may be accomplished by conventional techniques utilizing the patterns of narrow dimensioned dielectric regions as a mask therefor. Photolithography tecniques may be utilized in conjunction with the narrowed dimensioned regions 56 to block off regions where it is not desired to change their conductivity. In this manner the PN junction in the left portion of the FIG. 5D has been formed together with the P+ regions on the right side of the FIG. 5D structure.

Figure 5E:
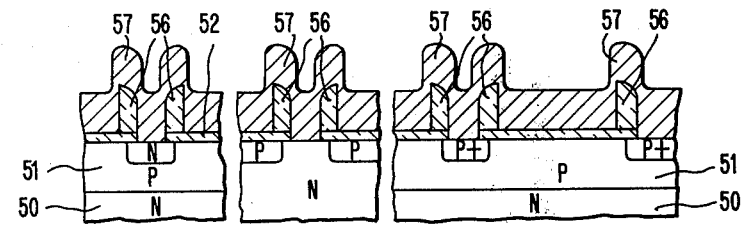
Figure 5F:
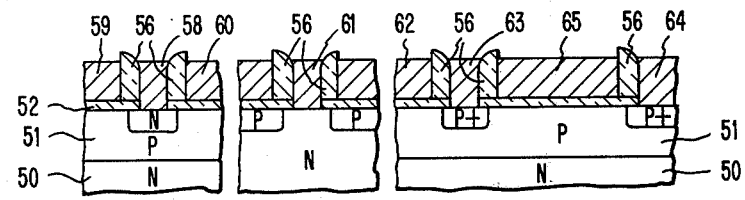

The formation of the metal contacts to the various devices can be understood with reference to the FIGS. 5E and 5F. A blanket deposition of a metal layer 57 forms the structure illustrated in FIG. 5E. The conductive layer 57 may be any layer which can be etched using reactive ion etch, plasma etch, or wet chemical etch while using the plastic layer as a mask. Typical materials are aluminum, aluminum-copper, chromium + aluminum-copper, etc. The layer is preferably deposited by evaporation and in the thickness of between about 0.8 to 1.5 micrometers. The precise thickness of the conductive layer is not critical, but the vertical dimension of the dielectric stud 56 and the thickness of layer 57 should be nominally equal to maintain planarity of the final structure. The structure is then planarized by applying a plastic, such as a photoresist or a polyimide material. The application of this film is typically by the spin on technique commonly used for conventional photolithography process. A nominal film thickness for the plastic layer is equal to the stud height 57 plus about 20%. Formation of the plastic layer in this manner results in a layer thickness of ≦3000 A over the stud and ≧1.2 micrometers over the lower regions of layer 57. The planarized structure is now placed in a reactive ion etching ambient. Etching is executed in an oxygen ambient to remove about 5000 A of the plastic layer thus exposing the peaks of conductive layer 57 while retaining about 8000 A of the plastic layer over the off-stud regions. Etching of layer 57 over the dielectric studs 56 may be accomplished using wet chemical etching, plasma etching or reactive ion etching. The retained regions of plastic layer are used to "mask" the underlying regions of conductive layer 57 during the removal of the conductive layer 57 over the dielectric studs 56. FIG. 5F shows a contact 58 to a N region within a P region. This contact 58 to the PN junction element is separated from metal lines 59 and 60 which are located on the first insulating layer 52. In the center section of the FIG. 5F there is shown a Schottky barrier diode anode contact 61 to the N type silicon body which contact is separated from another metal line 62. A P+ resistor is shown in the righthand side of FIG. 5F wherein contacts 63 and 64 are made to the P+ contact regions in the P region. Another metal line contact is shown at 65. The plastic layer is removed by oxygen ashing. The oxygen ashing of the plastic layer is accomplished in a commerically available barrel type plasma etch tool using an oxygen ambient and system power input of 300 to 400 watts.

FIG. 6 may be formed according to the FIG. 5A through 5F process wherein a N channel field effect transistor structure is the resulting device. The silicon body 50 in the case of making a field effect transistor is of a P type. No epitaxial layer is needed to be formed on the P type substrate under most circumstances. Dielectric isolation can be used to form isolated regions of monocrystalline silicon for field effect transistor devices to be formed therein. The FIG. 6 device however does not illustrate such a pattern of dielectric isolation. The dielectric isolation is utilized where highly dense integrated circuits are formed in the silicon body. The process continues as shown through FIG. 5D wherein N+ regions 67 are formed by either diffusion or ion implantation techniques to act as the source and drain of the devices. The doping of the N+ source and drain is preferably performed prior to sidewall fabrication. The first insulating layer 52 can either be chosen to be the thickness of the gate dielectric 68 or the gate dielectric 68 can be grown to the desired thickness of the gate region as shown in the FIG. 6 structure. The FIG. 5E and FIG. 5F process can be used to form the contacts to the source and drain regions 69 and forming the gate electrode 70. The gate dielectric can alternatively be formed of silicon dioxide or combinations of other materials such as silicon nitride, aluminum oxide and silicon dioxide.

Figure 7D:
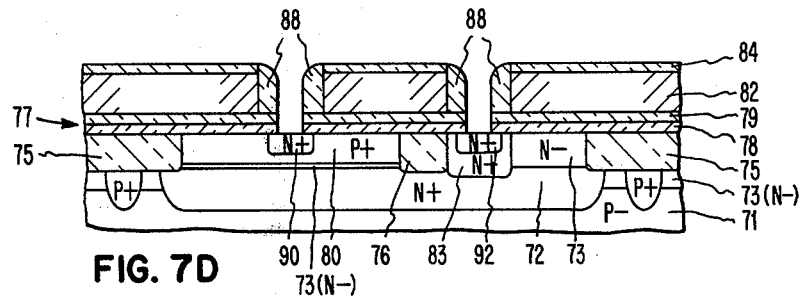

FIGS. 7A through 7G and 8 illustrate a further embodiment utilizing the self-aligned metal process to form bipolar integrated circuits. The process is illustrated to form NPN bipolar transistors. However, it would be obvious that the PNP transistors can alternatively be formed by simply reversing the polarities of the various elements of the transistors and associated regions. FIG. 7A illustrates one small, greatly enlarged portion of a silicon body which will be used to form a very dense bipolar integrated circuit. A P-substrate of monocrystalline silicon 71 has a subcollector N+ diffusion 72 made therein. An epitaxial N layer 73 is then grown on top of the substrate. These processes are standard processes in the formation of, for example, NPN bipolar transistors. The substrate is typically a <100> crystallographic orientation silicon wafer having a resistance of the order of 1 to 20 ohm-cm. The subcollector diffusion is typically formed using arsenic having a surface concentration of about $10^{20}$ atoms/cm$^3$. The epitaxial growth process to form layer 73 may be by conventional techniques, such as the use of SiCl$_4$/H$_2$ or SiH$_4$/H$_2$ mixtures at temperatures about 1000° C. to 1200° C. During the epitaxial growth, the dopant in the N+ layer moves into the epitaxial layer. The thickness of the epitaxial layer for highly dense integrated circuits is of the order of 3 micrometers or less. P+ regions can also be formed in the substrate 71 in the designated areas under which the recessed silicon dioxide isolating regions are to be formed. These P+ regions prevent surface inversion and current leakage. A mask, such as a thermally grown silicon dioxide layer (not shown) is formed on the surface of the epitaxial layer 73 and by suitable photolithographic and etching techniques mask openings are formed therein.

The next series of steps involves the formation of isolation means for isolating regions of monocrystalline silicon from other regions of monocrystalline silicon. The isolation may be by back biasing PN junctions, partial dielectric isolation or complete dielectric isolation. The dielectric materials used may be silicon dioxide, glass, etc. The preferred isolation for highly dense integrated circuits is dielectric isolation. The FIG. 7A shows partial dielectric isolation with dielectric regions 75 isolating monocrystalline silicon regions of the silicon body from one another and a region 76 which isolates the base emitter region from the collector reach-through region. There are many ways in the art to form dielectric regions of this type. It is preferred to use the process described in the Magdo, et al patent application, Ser. No. 150,609, filed June 7, 1971, or Peltzer U.S. Pat. No. 3,648,125. Alternatively, the process described in J. A. Bondur, et al U.S. Pat. No. 4,104,086 can be used. In that patent application and patents the processes for forming partial dielectric isolation for regions 75 and 76 are described in detail.

The N+ collector reach-through 83 to subcollector region 72 is formed using standard lithography, etching and diffusion or ion implantation techniques. Region 83 is typically formed with a phosphorus dopant.

The P+ base region 80 is formed at this time using silicon dioxide masking with standard lithography, etching and diffusion or ion implantation techniques. It is preferred that the base region abut the dielectric isolations, as shown in the drawing. The masking and lithography layers are then removed. A first insulating layer 77 which may be a composite layer of thermally grown silicon dioxide 78 and chemical vapor deposited silicon nitride 79 is formed on the surface of the silicon body. This insulating layer may be alternatively one or a combination of known insulating materials such as silicon dioxide, silicon nitride, aluminum trioxide, or the like, in addition to thermally grown silicon dioxide. The silicon dioxide layer 78 may be thermally grown in an oxygen or oxygen-water vapor ambient at a temperature of about 925° C. A second method for growing silicon dioxide involves the use of a chemical vapor deposition process wherein SiH$_4$, O$_2$ at about 450° C.; or SiH$_2$Cl$_2$, N$_2$O at a temperature of about 800° C. under atmospheric or low pressure conditions. The deposition of silicon nitride is usually formed by chemical vapor deposition using the following process conditions: SiH$_4$, NH$_3$ and N$_2$ carrier gas at a temperature of about 800° C. under atmospheric or low pressure conditions as discussed in the V. Y. Doo U.S. Pat. No. 4,089,992.

A coating 82 of polycrystalline silicon is now deposited over the entire wafer by using, for example, silane in a hydrogen ambient in a temperature range of 500° to 1000° C. The operative thickness of the polycrystalline silicon is between 8,000 to 15,000 Angstroms with 12,000 Angstroms preferred. Should the thickness be greater than about 15,000 Angstroms, planarity problems arise and make it difficult to fabricate high circuit density chips. If the thickness is less than about 5,000 Angstroms, selective removal of the conductive layer from the top of the dielectric studs becomes difficult to control without removing the conductive layer from the off-stud regions. The polycrystalline silicon makes no electrical contact to the silicon body since it is formed upon the first insulating layer 77.

The structure is placed in chemical vapor deposition ambient to form the second insulating layer such as silicon nitride layer 84 on the surface of the polycrystalline silicon. Standard photolithography and etching techniques may be utilized to form openings in this silicon nitride layer 84 over the areas which are designated to be the emitter areas and the collector reach-through areas. Alternatively, other materials such as chemical vapor deposited silicon dioxide, silicon nitride or combinations of these materials can be used in place of the thermally grown silicon dioxide layer. The thickness of the second insulating layer mask is typically 500 to 2,000 Angstroms. The structure is placed in a reactive ion or plasma etching environment for a polycrystalline silicon having typically the conditions as follows: for example, Cl$_2$-Argon or CCl$_4$-Argon, RF parallel plate structure about 10 microns pressure, 0.16 watts/cm$^2$ power density and 10 cc/minute flow rate and using the apparatus described in Harvilchuck, et al patent application, Ser. No. 594,413, filed July 9, 1975, now abandoned continuation patent application Ser. No. 822,775, filed Aug. 8, 1977, now abandoned and continuation patent application Ser. No. 960,322 filed Nov. 13, 1978. The reactive ion etching process is completed when the dielectric layer 79 is reached. The etch rate ratio of [polycrystalline/SiO$_2$(or Si$_3$N$_4$)]≧10:1 for the polycrystalline silicon reactive ion etching.

The resulting structure is shown in FIG. 7B wherein the emitter window and the collector reach-through window produces regions in the silicon structure having horizontal surfaces 86 and vertical surfaces 87. A conformal layer 88 is deposited on both the substantially horizontal surfaces 86 and the substantially vertical surfaces 87. This layer 88 is typically formed by chemical vapor deposition. This conformal layer must be as formed on an electrical insulator or capable of being changed to an insulator and may be one of several insulating materials, such as silicon dioxide, silicon nitride, aluminum oxide, polycrystalline silicon and combinations of these materials. For this example a layer of silicon dioxide for conventional chemical vapor deposition is used.

FIG. 7C shows the result of this step. The thickness of the conformal layer 88 is chosen for device design purposes such as the metal-to-metal conductor separation. The thickness of the conformal layer is between about 3,000 to 12,000 Angstroms and preferably 7,000 Angstroms. The thickness may depend upon the particular layer used. For example, where polycrystalline silicon is the layer and it must have its surfaces ultimately oxidized, a thinner polycrystalline silicon layer is used than when an insulator conformal coating is originally deposited. Where the thickness is greater than 15,000 Angstroms, longer etching times are required. Where the thickness is less than 5,000 Angstroms capacitance between adjacent metal lines becomes large. The FIG. 7C structure is placed into a suitable reactive ion etching ambient for the material of layer 88. For example, in etching silicon dioxide, the conditions are such that an etch ratio of about 10/1 $(SiO_2)/(Si)$ is desirable. Over etching is needed to be sure $SiO_2$ is removed and/or etch stop indicator is used. The reactive ion etching process substantially removes the horizontal portion of layer 88 and provides the pattern of narrow dimensioned vertical regions on the silicon body which is shown in FIG. 7D.

The next step is to provide the emitter 90 and collector reach-through 92 regions. Where it is desired to form the N+ emitter region 90 and collector reach-through region 92 by means of thermal diffusion, the reactive ion etching of layer 88 is accomplished all the way down to the bare silicon surface and the thermal diffusion process for a N type impurity, such as arsenic or phosphorus, under the usual conditions for making emitter diffusions and depending on the desired emitter depth and, for example, an arsenic capsule diffusion at 1000° C. may be utilized. Where it is desired to ion implant impurities into the body to form the emitter region 90 and collector reach-through region 92, it is preferable to implant these impurities through a thin insulating screen layer (not shown). The formation of this screen is accomplished simply by allowing the reactive ion etching to remove the insulator from the horizontal surfaces, except for a thin screen layer (not shown). Alternatively, the insulator is completely removed and a thin silicon dioxide is grown to form the screen. The structure is then placed in ion implantation apparatus wherein desired impurities such as arsenic, phosphorus, or the like, pass through the screen layer (not shown) to form the diffused regions 90 and 92. The conditions of such an ion implantation process are a $9.5 \times 10^{15}$ atoms/cm² dose of arsenic at 50 KeV power. A drive-in step involves a temperature of about 1000° C. in inert gas followed by a oxidizing atmosphere.

Figure 7E:
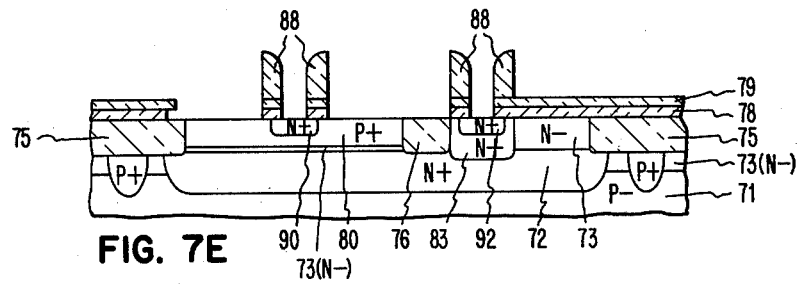
Figure 7F:
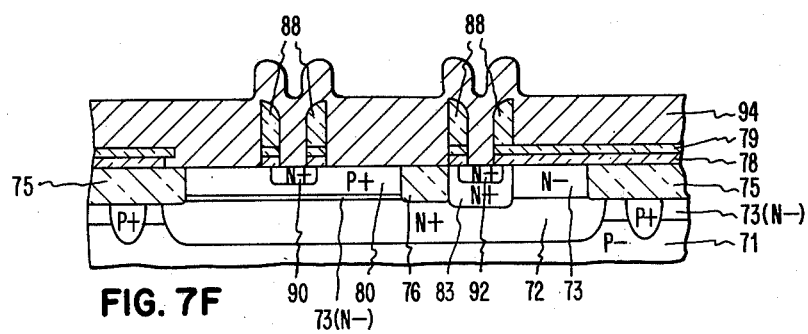
Figure 8:
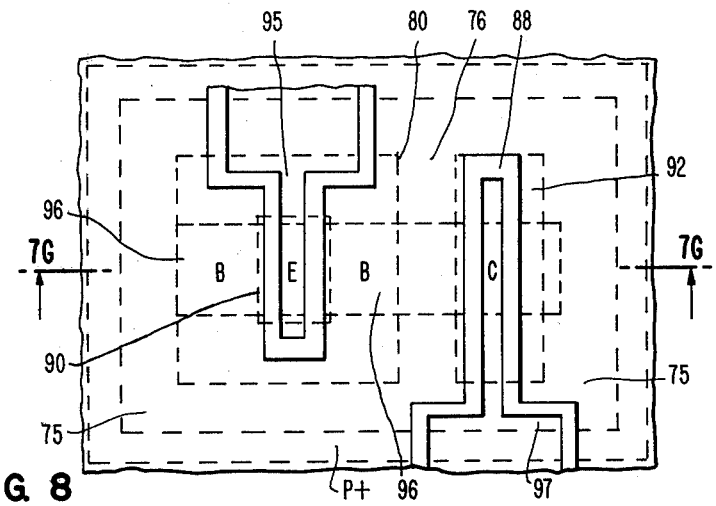
FIG. 8 illustrates the resulting top view of the process of FIGS. 7A through 7G.

Referring now to FIGS. 7E, F, and G and FIG. 8, $H_3PO_4$ etch of $Si_3N_4$ layer 84 is required followed by the removal of the remaining polycrystalline silicon layer 88 by pyrocatechol etching solution to produce the FIG. 7E structure. Layer 77 is wet etched, reactive ion etched or plasma etched to open the contacts to the device to produce the FIG. 7E structure. A blanket coating of metal 94 is deposited over the pattern of narrow dimensioned dielectric regions to form the FIG. 7F structure. The preferred metal layer is formed of chromium and aluminum-copper by evaporation or sputtering. The blanket metal layer is deposited over the narrow dimensioned dielectric regions and in the areas there between so that in the areas between the narrow dielectric regions that are uncovered with the second insulating layer electrical contact is made to the monocrystalline silicon body elements therein. The surface of the FIG. 7F structure is planarized by a blanket deposition of a plastic material over the metal layer. This plastic material can be typically a photoresist or a polyimide material, or the like. The plastic material is deposited using the spin-on technique as is common practice for photolithography resist or polyimide apply processes. Commercially available 1.0–2.0 micrometer grade photoresist is typically used, and is applied at a spin speed of 3000–4000 rpm yielding a nominal film thickness of 1.3 to 1.5 micrometers. The plastic layer thickness over the dielectric stud is typically 1000–3000 Å.

The planarized structure is placed in a reactive ion etching ambient. Etching is performed in an oxygen ambient for all plastic layers removing 3000–5000 Å. The conductive layer is exposed over the dielectric studs, but is not attacked by the oxygen etch. Subsequently, the metal over the dielectric studs is removed by conventional wet chemical etch, plasma etch, or reactive ion etching. During this etch the retained plastic layer serves to mask the off-stud regions of the conductive layer. Alternatively, the reactive ion etching may uniformly etch the plastic and the metal layer until the tops of the narrow dimensioned dielectric regions are reached. The remaining plastic material is removed by, for example, oxygen ashing, or other suitable processes. Ashing of photoresist is accomplished in an oxygen ambient using a commercially available barrel type plasma each tool operated at 300–400 watts for 30–60 minutes.

Figure 7G:
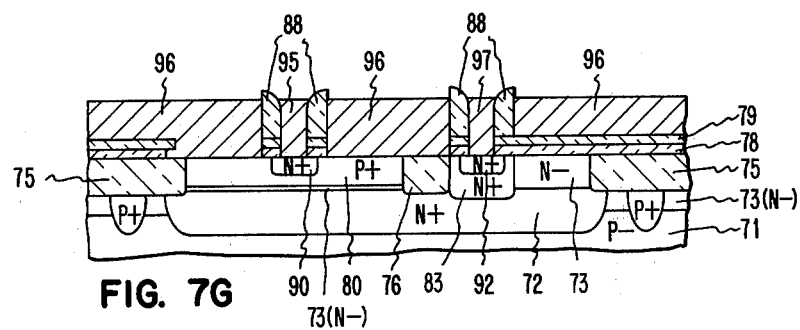

The result of the process is the substantially planar structure of FIG. 7G wherein the emitter contact is 95, the base contact is 96 and the collector contact is 97. FIG. 8 shows the top view of the structure. FIG. 7G is taken along 7G:7G of FIG. 8.

The resulting self-aligned metal structure places the metal over the base contact to within about 3500 Å from the edge of the emitter, thereby essentially eliminating the extrinsic base resistance of the device. Reduction of the base resistance is one of the primary goals for enhanced bipolar device performance. The reduction of base resistance achieved with this technique is superior over prior art structures which use doped polycrystalline silicon, or metal silicides of polycrystalline silicon to reduce the extrinsic base resistance.

The FIG. 8 layout shows how the metal over the N+ emitter region can be isolated from the metal over another N+ region, that is the collector, and from the P base region in between with submicron metal-to-metal spacing.

Figure 9A:
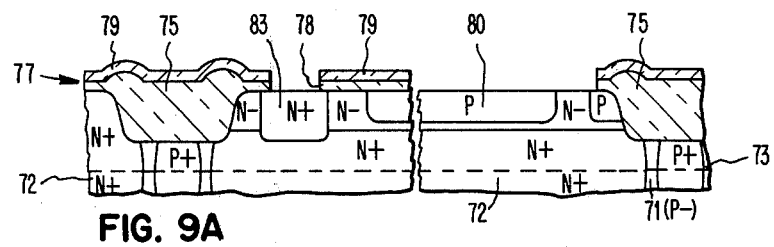
FIGS. 9A through 9H illustrate another method embodiment and resulting structure for forming products according to the present invention.
Figure 9B:
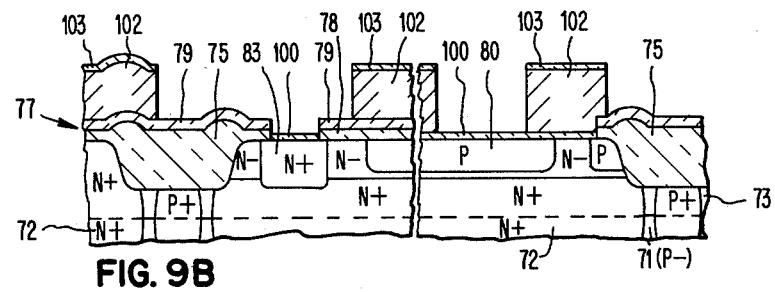
Figure 9C:
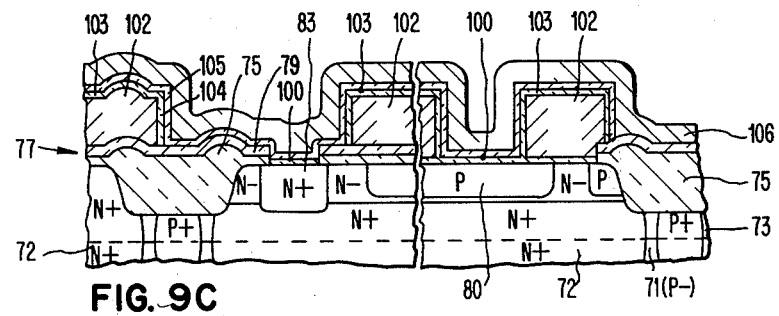
Figure 9D:
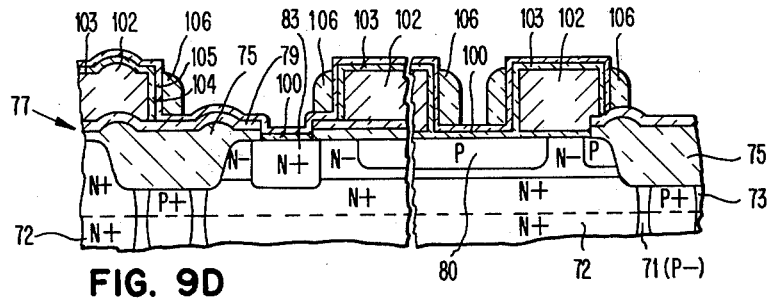

FIGS. 9A through 9H illustrate another embodiment of a method for forming self-aligned metal integrated circuit structures. FIG. 9A is a greatly enlarged portion of such integrated circuit at an intermediate stage of its manufacture. The particular integrated circuit structure being manufactured includes NPN bipolar transistors and Schottky barrier diodes. The FIG. 9A structure has been manufactured in the identical manner described to that described in FIG. 7A above with certain exceptions. The major exception is the choice of the recessed oxide isolation is the process described by the I. Magdo, et al patent application Ser. No. 150,609, filed June 7, 1971, and Peltzer U.S. Pat. No. 3,648,125. This process produces the characteristic "birds head" and "birds beak" structures which is seen in the FIG. 9 structure. The second major difference is that an opening is provided in the first insulating coating for a Schottky barrier diode, as well as for the emitter, base, and collector reach-through contacts. Further, it is seen that the emitter and base contact openings are replaced by a single opening. A third difference is that the FIG. 9A does not use recessed oxide isolation structure between the base region and the collector reach-through region. Where like elements are shown, like numbers are given between FIGS. 7A and 9A.

The FIG. 9A structure is subjected to a thermal oxidation ambient such as oxygen and/or steam at a temperature of 925° C. to regrow portions of the first insulator layer over the contact openings shown in FIG. 9A. The resulting silicon dioxide coating is layer 100. A first layer 102 of polycrystalline silicon is now formed on the first insulating layer 77,100. The preferred method for forming this polycrystalline silicon layer, together with its preferred thicknesses are identical to that described in regard to the FIG. 7 process. The structure is put into a reactive ion etching ambient as described in the description concerning FIG. 7B above to form the substantially vertically and substantially horizontal surfaces. The openings are made in the first polycrystalline silicon layer 102 to the regions designated as above the emitter and collector reach-through. The Schottky barrier diode designated region remains covered with the polycrystalline silicon layer, as shown on the left side of FIG. 9B. Silicon nitride layer 103 was utilized as the etch mask for the first layer of polycrystalline silicon. The structure is then subjected to a conventional thermal oxidation to form silicon dioxide layer 104 on all unmasked surfaces of the polycrystalline layer 102. A silicon nitride layer 105 is chemically vapor deposited by the conventional techniques as described above on top of the silicon dioxide layer 104. A second polycrystalline silicon conformal layer 106 is deposited over the silicon dioxide and silicon nitride layers 104 and 105. The result of this series of process steps is FIG. 9C.

Figure 9E:
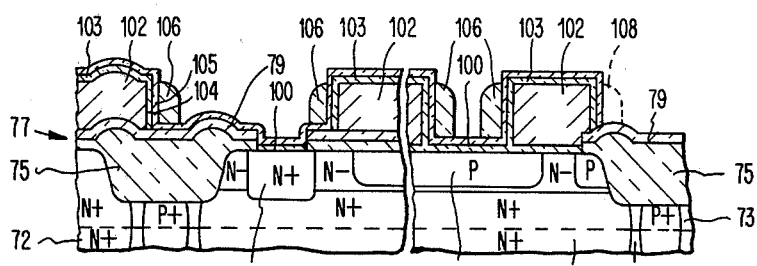
Figure 9F:
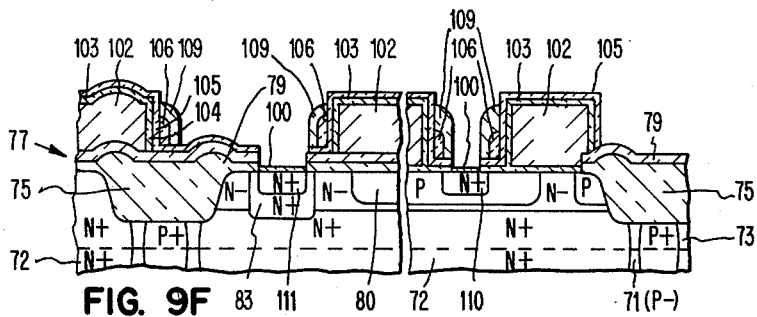
Figure 9G:
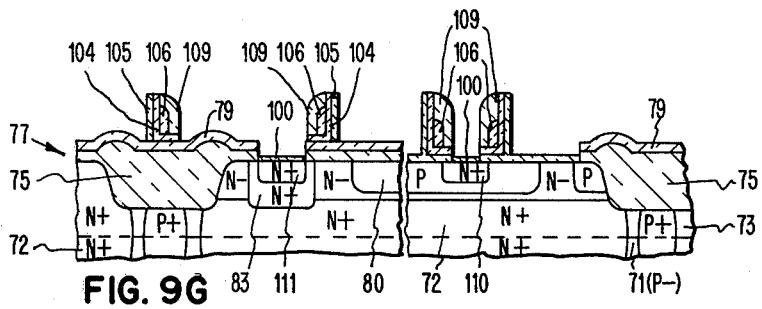

The pattern of narrow dimensioned dielectric regions is now formed by the steps illustrated in FIGS. 9B, 9E, 9F and 9G. The FIG. 9C structure is placed in a reactive ion etching ambient which is the same as the process for etching layer 102. A typical etch process is performed in an R.F. parallel plate reactor using $SF_6+Cl_2$ in a He carrier at a system pressure of 70-120 microns of Hg and an input power density of 0.14 to 0.18 watts/cm$^2$. The flow range is 20-50 cc/min of 7.5:$SF_6$:2.5:$Cl_2$90.0:He in parts by volume. The etch rate ratios of polycrystalline silicon: $Si_3N_4$ are $\geq$10:1. The resulting structure is given in FIG. 9D wherein the polycrystalline silicon regions on the vertical surfaces remain while all horizontal regions of the layer 106 has been removed by the reactive ion etching process. Should it be necessary, photolithography and etching techniques can be utilized to remove portions of the pattern of polycrystalline silicon narrow dimensioned regions. This is illustrated at 108 wherein a portion of the polycrystalline silicon pattern has been removed, as shown in FIG. 9E. The polycrystalline silicon layer pattern 106 is now subjected to a thermal oxidation ambient conditions at the conventional temperature to oxidize the surface of the polycrystalline silicon layer 106 to a silicon dioxide layer 109. The oxidation to silicon dioxide need not consume the whole polycrystalline region as is illustrated in the FIG. 9F structure. The portions of the insulating layer 100 which are over the areas designated to be the part of the first insulating layer that covers the contact, that is, silicon dioxide layer 100, is removed by a conventional silicon dioxide etch, such as reactive ion etch using $CF_4$ or a conventional wet chemical etch when it is desired to thermally diffuse N+ region 111. Either a thermal diffusion is made using arsenic or phosphorus dopant to form the N+ emitter and collector reach-through regions 110 and 111, respectively, or the screen oxidation is accomplished plus an ion implantation step using arsenic or phosphorus ions plus a conventional annealing cycle to fully form or activitate the emitter and collector reach-through regions 110 and 111. After either the diffusion or ion implantation, it is desirable to form a thin layer of about 300-400 A of silicon dioxide on the N+ regions 110 and 111. This completes the steps to form the FIG. 9F. The silicon nitride layer 105 is removed by etching with a hot $H_3PO_4$ or RIE using $CF_4$, or the like, etchant. A pyrocatechol etchant is now utilized to completely remove the remaining first layer of polycrystalline silicon 102. At this point, only the pattern of narrow dimensioned dielectric regions remain on the major surface of the silicon body. These regions are composed of a composite of silicon dioxide, silicon nitride, and an inner core of the remaining second layer of polycrystalline silicon. The dimensions of these regions are typically in the range of 0.5 to 1.2 microns in width and 0.8 to 1.5 microns in height. The silicon dioxide layers present over the various contact openings, such as the emitter base, collector reach-through, Schottky diode region and diffused resistor regions (not shown) are removed by a conventional dip etching process utilizing a hydrofluoric acid etchant.

Figure 9H:
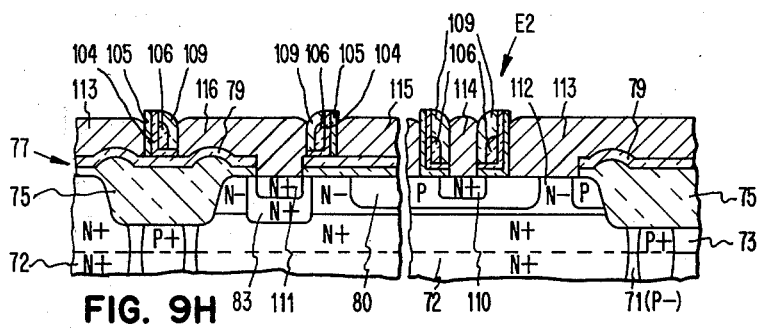

A contact metal, such as palladium, platinum, titanium, or the like, is deposited, sintered and etched under the following conditons. If PtSi contact metallurgy is used, the unreacted platinum is removed in aqua regia after sintering. Similarly, if other silicides are used, other suitable etchants are used. The contact metal may be sputtered or evaporated to a thickness of 500-1000 A. The resulting contact is a thin metal silicide structure on the surface of each of these regions (not shown). A blanket metal deposition of a metal such as aluminum, aluminum-copper or chromium and aluminum-copper is deposited over the major surface which contains openings to the elements of the silicon body, first first isolating layer 77 and the pattern of dielectric regions. The result of this deposition is a rather non-planar surface. The surface is made planar by depositing a plastic material as described in regard to the FIG. 7F and 7G process. The plastic material is removed such as described in regard to the FIG. 7 process typically by oxygen reactive ion etching. The resulting structure is shown in FIG. 9H. The contacts to the electrical devices are self-aligned to the narrow dimensioned regions. The structure is substantially planar. The structure shown in FIG. 9H includes contacts to a Schottky barrier diode region 112 wherein the Schottky anode contact is 113; and a NPN transistor having emitter contacts 114, base contacts 115 and collector reach-through contacts 116.

Figure 10:
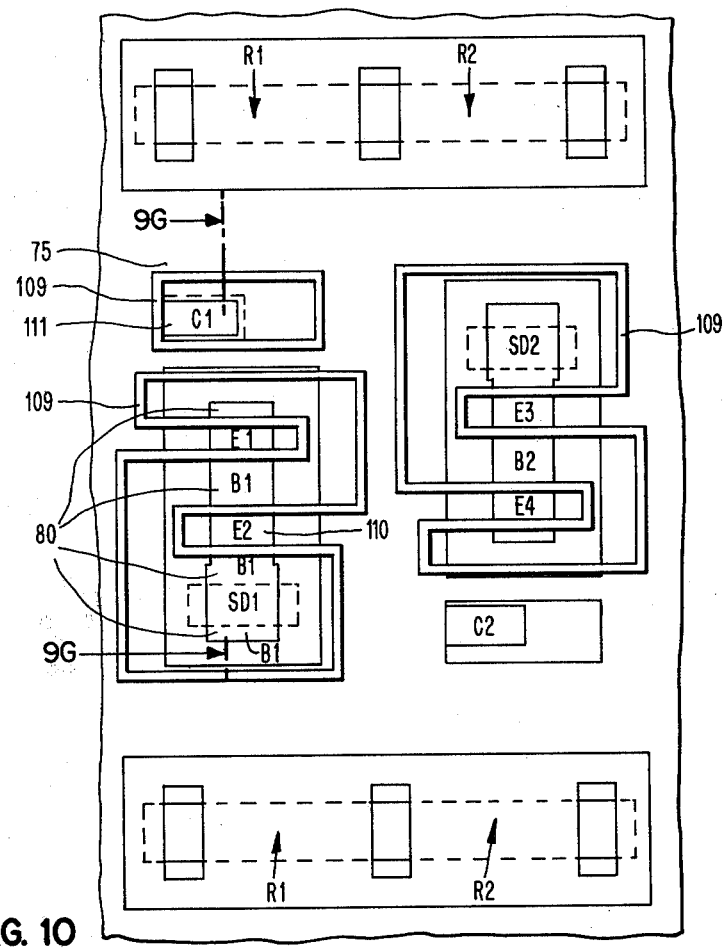
FIGS. 10 and 11 shows a memory cell horizontal layout at two different stages of manufacture for the FIG. 12 memory cell made according to the present invention.
Figure 11:
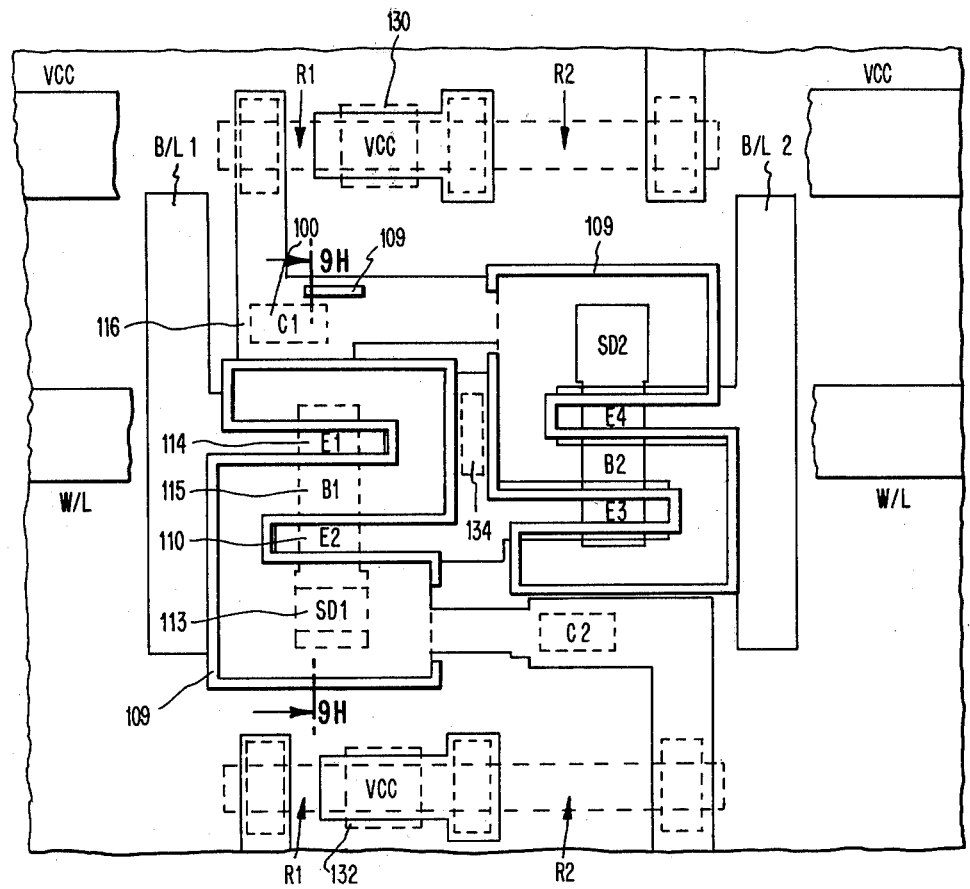
Figure 12:
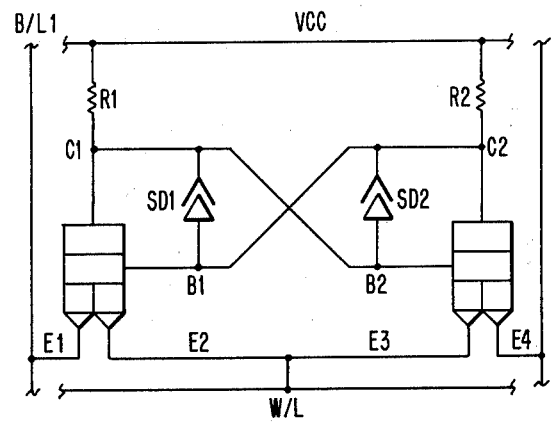

The FIGS. 10, 11, and 12 illustrate the design of a double emitter memory cell layout and circuit with integrated Schottky barrier diodes and P diffused resistors. The layout of FIGS. 10 and 11 utilizes the process described in FIGS. 9A through 9H to manufacture. The like numbers indicate like elements in FIGS. 9G and 9H, 10, 11, and 12.

FIG. 10 shows the recessed oxide isolation 75, base region 80, E2 emitter region 110, N+ collector reach-through contact 111, ion implanted resistors R1 and R2, and pattern of narrow dimensioned regions 109. Note that emitter E1 is not shown in the cross-sectional drawings 9G or 9H in the interest of space. It is identical to E2 which is shown.

FIG. 11 shows the pattern of studs 109 after selective removal of portions of the pattern by etching techniques; NPN contacts for emitter 114, base 115 and resistors R1, R1, collector 116; and Schottky diode anode contact 113. The second level metal runs horizontally and is used to supply positive bias (VCC) to the resistors through vias 130 and 132. The second level metal also connects the two emitters to the word line, W/L, through via 134, as shown in FIG. 11. Bit lines B/L1, B/L2 and cell interconnections are done with the first level metal. The lift-off process is used to define both the first and second level metal patterns. The lift-off process may be better understood by reference to J. R. Franco, et al, U.S. Pat. No. 4,004,044 which is one example of such a process. FIG. 12 shows the electrical equivalent circuit of the cell shown in FIG. 11.

Figure 13A:
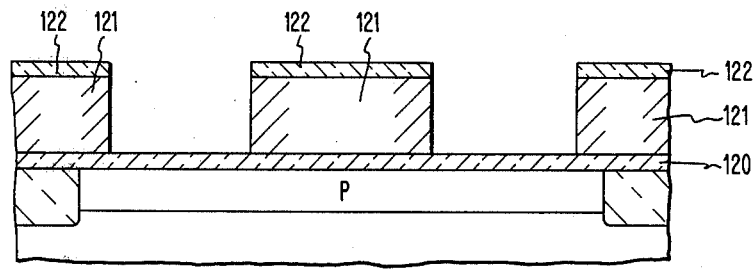
FIGS. 13A through 13D show a process for making an even smaller bipolar transistor utilizing another method embodiment of the present invention.
Figure 13B:
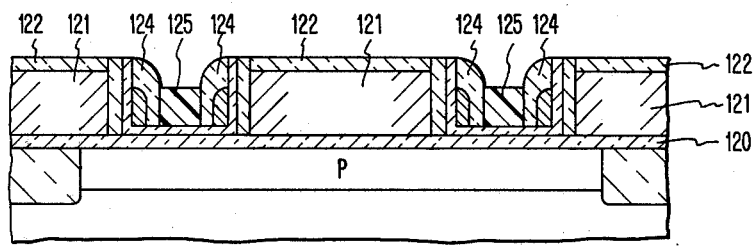
Figure 13C:
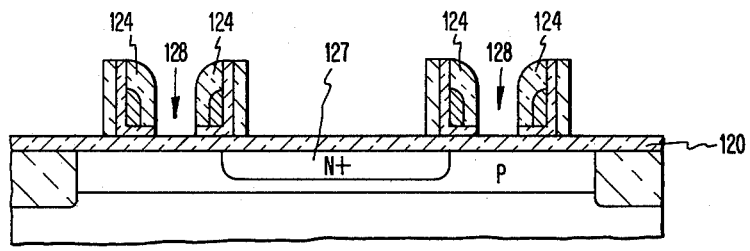
Figure 13D:
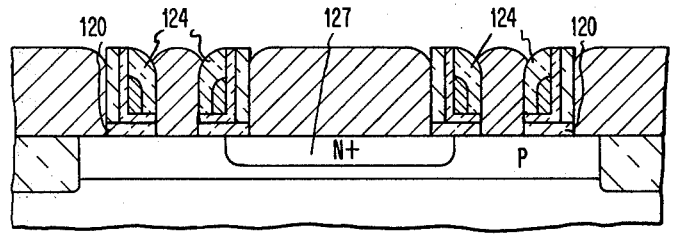

There are many variations to the processes described above. One of the most critical problems in high density integrated circuits is the emitter structure. The FIGS. 13A and 13D illustrate an improved method for forming the emitter for the self-aligned metal process. The emitter size is determined by current density considerations. Using a ground rule of a minimum line width of 2.5 microns, a 2.5 emitter width line is assumed which results in a device size using a self-aligned metal structure of the present invention of 0.9 microns. To overcome this narrowed emitter problem, the base contact can be reduced since the current density is negligible for the base contact. This is achieved if the emitter narrow dimensioned dielectric region or sidewall is determined from the "outside", rather than "inside", as shown in the above described process, the base contact windows can be reduced without change in device characteristics, and a 20 percent density improvement is achieved. The process is modified as follows to produce this advantageous density improvement. After the base diffusion and reoxidation, the base silicon dioxide is removed by etching and reoxidized to about a 250 Angstrom layer of silicon dioxide 120. A first layer of polycrystalline silicon 121 is deposited thereover. A layer 122 of silicon nitride is then formed on the surface of the polycrystalline silicon layer 121. The contact openings are then defined by photolithography and etching techniques in the silicon nitride layer 122, and the polycrystalline layer 121 is reactive ion etched to the silicon dioxide layer 120 to form the substantially horizontal and substantially vertical regions on the major surface of the silicon body. The process now continues either in using the silicon dioxide insulator, or the like, conformal layer as described in the FIG. 7A through 7F embodiment or the composite pattern of narrow dimensioned dielectric regions of silicon dioxide, silicon nitride and polycrystalline silicon as described in the FIGS. 9A through 9H embodiment. For illustrative purposes, the FIGS. 9A through 9H embodiment is shown to have been formed resulting in the FIG. 13B structure wherein the pattern of narrow dimensioned dielectric composite regions are indicated as number 124. A plastic material, such as photoresist or polyimide 125 is spun onto the surface by conventional techniques to produce approximately 1.2 microns thick coating over the entire major surface. A reactive ion etching step is utilized to expose the top surface of the silicon nitride layer 122 over the polycrystalline silicon layer 121. The silicon nitride layer 122, shown in FIG. 13B, is then reactive ion etched to completely remove it. The polyimide or photoresist layer 125 is then removed by oxygen ashing. The polycrystalline silicon layer 121 is removed in a pyrocatechol solution, or the like. The emitter 127 is implanted through the thin silicon dioxide layer 120. This is possible because the pyrocatechol does not attack the silicon dioxide material in any significant way. This emitter ion implant in the base contact regions 128 or any Schottky barrier diode regions (not shown) are masked by the thermal silicon dioxide layer 120 and silicon nitride. After the emitter annealing step of a temperature of 900° C.–1000° C., any undesired silicon nitride is removed in hot $H_3PO_4$, and the emitter silicon dioxide layer 120 is removed by reactive ion etching. The base and any Schottky barrier diode silicon dioxide layer 120 which remains can be dip etched to complete that portion of the process. The self-aligned metal structure of FIG. 13D can be completed by the deposition of the blanket metal and the reactive ion etching techniques described in relation to FIGS. 7A through 7F and FIGS. 9A through 9H. As can be seen from the FIG. 13D, the NPN transistor device size is reduced without changing the emitter size to less than the minimum width in the chosen ground rule. The process also has the advantage of protecting the designated emitter regions during the process which eliminates the need of any possible etching into the emitter regions.

Figure 14A:
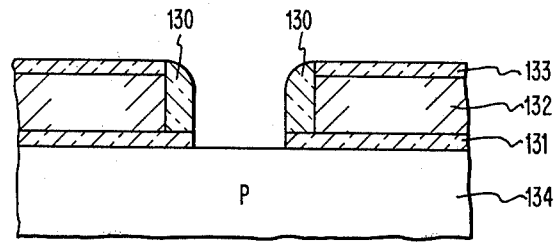
FIGS. 14A through 14D illustrate the formation method of a self-aligned polysilicon emitter contact embodiment as part of the present invention.
Figure 14B:
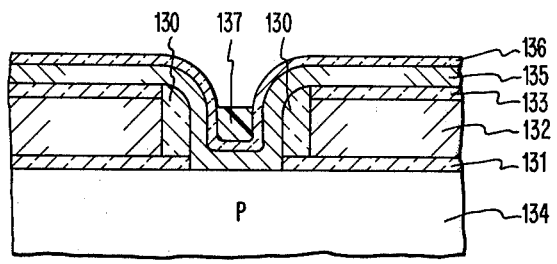
Figure 14C:
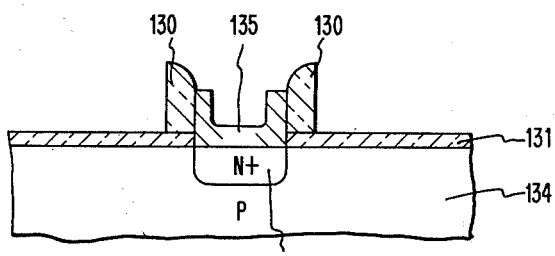
Figure 14D:
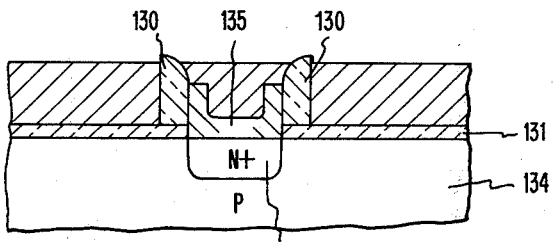

Another embodiment to form an improved emitter structure using the self-aligned metal process is shown in FIGS. 14A, 14B and 14C. The resulting structure from this process produces a self-alignment of polycrystalline silicon contacts to the monocrystalline silicon emitter contact holes. The process is identical to those shown in FIGS. 7A through 7F and FIGS. 9A through 9H through the pattern of narrow dimensioned dielectric regions or sidewall structures 130. The first insulating layer 131 has a first polycrystalline silicon layer 132 formed thereover, and a silicon nitride layer 133 deposited onto the polycrystalline silicon layer. Only that portion of the integrated circuit structure which includes the P type base region 134 is shown for simplicity in the FIGS. 14A through 14C. The emitter contact openings are dip etched open to form the FIG. 14A structure. A second layer 135 of polycrystalline silicon of a narrow thickness which might be, for example, about 500 Angstroms is formed as shown in the FIG. 14B. An emitter screen silicon dioxide 136 of about 250 Angstroms is formed over the polycrystalline silicon layer 135 by thermal oxidation. The desired dopant, either N or P, is then ion implanted through the screen silicon dioxide layer 136 into the polycrystalline silicon layer 135. Typical implant conditions for an arsenic emitter are a dosage of $1.0 \times 10^{16}$ ions/cm$^2$ implanted at an energy of 50 KeV or for shallower devices 70 KeV, $5.0 \times 10^{15}$ ions/cm of $^{75}As^+$. A planarizing film of about 0.8 to 1.2 microns of a suitable plastic, such as a photoresist material, polyimide, etc. is deposited by the conventional spin-on process. The structure is then put into a reactive ion etching ambient to remove the plastic layer 137 down to the silicon dioxide layer 136, except in indentation as shown in FIG. 14B. Reactive ion etching is typically performed in an oxygen ambient using a parallel plate apparatus. The FIG. 14B structure is subjected to a reactive ion etching ambient of carbon tetrafluoride ($CF_4$) to remove the emitter screen silicon dioxide layer 136, the polycrystalline silicon layer 135 and the silicon nitride layer 133. Only the layers 135 and 136 underneath the remaining plastic layer 137 remains on the structure after this step. The plastic resist material 137 is removed by a suitable oxygen asher process as described above and a hot acid cleaning step is provided. The structure is annealed to form the N+ emitter 138 by an outdiffusion from the self-aligned polycrystalline silicon emitter contact 135. The first layer of polycrystalline silicon 132 is removed by pyrocatechol etchant, and the remaining silicon dioxide layer 136 is removed by a suitable conventional etchant which is buffered hydrofluoric acid or reactive ion etchant. The self-aligned metal layer is then formed as described with the FIGS. 7F and 9H to form the self-aligned metal contacts to the base region, the polycrystalline silicon emitter contact 135, the collector reach-through contact (not shown) and any other contacts on the highly dense integrated circuit structure.

The following example is included to merely aid in the understanding of the invention, and variations may be made by one skilled in the art without departing from the spirit and scope of the invention.

EXAMPLE

The feasibility structures for the self-aligned metal high density integrated circuit structure were formed on a silicon body 140. A first insulating layer 142 of 400 Angstroms was formed by thermal oxidation on the silicon body 140. A first polycrystalline silicon layer 144 of 10,400 Angstroms was deposited by low pressure chemical vapor deposition. A 1,600 Angstrom layer (not shown) of silicon nitride was deposited by chemical vapor deposition process under the conditions of 1000° C. in an ambient of $NH_3 + Si_3H_4$. The photoresist layer was removed by oxygen ashing. Using the silicon nitride layer as a mask, the polycrystalline silicon layer 144 was subjected to a reactive ion etching ambient of sulfur hexafluoride and chlorine ($SF_6 + Cl_2$) under the conditions of 0.14–0.18 watts/cm$^2$ and about 50–100 microns of Hg pressure in a parallel plate R.F. reactor. The first layer of polycrystalline silicon 144 was thereby etched to form substantially horizontal and substantially vertical surfaces on the body. The structure was placed in a thermal oxidation ambient to form a silicon dioxide layer of 800 Angstroms on the surface of the polycrystalline silicon body 144. The conditions of the thermal oxidation were as follows: 925° C., 20 mins., in a wet HCL (1:1) thermal oxidation ambient. A silicon nitride layer of 500 Angstroms in thickness was deposited by the following process: chemical vapor deposition at 1000° C. using $SiH_4 + NH_3$ in $H_2$ carrier. A second polycrystalline silicon layer was deposited having a thickness of 7,000 Angstroms by the following process: low pressure chemical vapor deposition at 625° C. using $SiH_4$ in a $N_2$ carrier. The second polycrystalline silicon layer was placed in a reactive ion etching ambient having the following conditions: $SF_6 + Cl_2$ (7.5%, 2.5%) in He (90%) etch in a parallel plate reactor at about 0.14–0.18 watts/cm$^2$ at about 50–100 microns pressure to form the pattern of narrow dimensioned dielectric regions or sidewall 145. The second polysilicon layer is oxidized to form a surface silicon dioxide on the sidewall which results in the final sidewall structure of FIG. 15A. The FIGS. 15A through 15F and 16 are scanning electro micrographs of magnification of from 3,000X to 20,000X. The thin, about 500 Å, silicon nitride layer which functions as the etch stop and oxidation barrier during sidewall reactive ion etching step and reoxidation is removed by reactive ion etching in a parallel plate reactor using an ambient of $CF_4$, or the like, at about 40 microns pressure and a power density in the range of 0.18 to 0.26 watts/cm$^2$ with a gas flow of 20–40 cc/min. Reactive ion etching removal eliminates undercutting of the contact region. The remaining $Si_3N_4$ layer over the polysilicon is removed using heated (165° C.) $H_3PO_4$. The polycrystalline layer 144 is removed by use of a pyrocatechol etching solution heated to about 115° C. The etching solution contains ethylenediamine, pyrocatechol, and deionized water in the ratio of 7.5 ml:2.5 gm:1 ml. The result of this process is the FIG. 15B which shows the pattern of narrow dimensioned dielectric regions or sidewalls on the insulating layer 142. A blanket aluminum layer 150 is vacuum deposited over the entire surface 142, 145. The thickness of this aluminum layer is about 8,000 Angstroms. FIG. 15C illustrates an actual cross-sectional enlargement of this structure wherein the narrow dimensioned composite region is composed of silicon dioxide 152, silicon nitride 153, second polycrystalline silicon layer 154 and silicon dioxide layer 155 formed from the oxidation of the second polycrystalline silicon layer. A polyimide layer 157 is applied by the conventional spin-on process. The structure is reactive ion etched. The etching is performed in a parallel plate reactor using an oxygen ambient at about 40 microns of Hg pressure and an input power of 500 watts. The FIG. 15D shows a cross-sectional view of the structure after the polyimide etch step. The white block in the photograph is a piece of silicon which was produced during sample preparation. The block is not a defect in the original structure. The metal layer is etched using a solution comprising 800 ml phosphoric acid, 50 ml nitric acid, 50 ml acetic acid, 100 ml deionized water, 2–3 ml of surfactant at a temperature of 45° C. FIG. 15E shows the post metal etch structure from a top view. The remaining polyimide layer 157 is removed by an oxygen ashing process typically using a barrel type plasma etch tool, an oxygen ambient and input power of 300–400 watts. The final structure is shown in FIG. 15F wherein the metal sidewall or narrow dimensioned region 145 isolates the metal contact regions 160 and 162 from one another.

During RIE etching of the first polysilicon layer 144 attack of the epitaxial silicon body 140 is prevented by the first insulating layer such as silicon dioxide layer 142 acting as an etch stop due to greater than 10:1 etch rate ratio of polysilicon to thermal silicon dioxide. The 800 Å $SiO_2$ and 500 Å $Si_3N_4$ films grown after etching of the first polycrystalline silicon layer 142 provide passivation for the emitter-base junctions. In addition, the 500 Å $SiN_4$ film acts as an etch stop and contact oxidation barrier during sidewall fabrication. The second polycrystalline silicon deposition primarily defines the width of the narrow dimensioned insulating region. The 3,700 Å reoxidation layer 155 protects the second polycrystalline silicon layer 154 during first polycrystalline silicon stripping. All other areas are also protected during first polycrystalline silicon strip by either $SiO_2$ or $SiO_2/Si_3N_4$ layer. FIG. 15B clearly shows the excellent pattern of narrow dimensioned region's or stud's integrity achieved.

After metal deposition, as shown in FIG. 15C, the metal 150 is substantially thinner over the sides of the stud 145. The metal line width between studs has been reduced to 1.4 μm from a 3.0 μm photolithography defined opening. Stud width for these samples is 0.8 μm and the height is about 1.1 μm. FIGS. 15D and 15E demonstrate the selective exposure and removal of the metal peaks.

Figure 17:
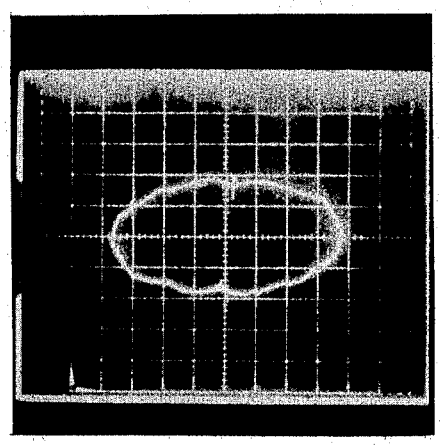
FIG. 17 shows the results of a continuity test for the test pattern of FIG. 16.

The final structure is seen in FIG. 15F. All metal has been removed from the top of the studs 145 achieving complete separation of adjacent metal lines 160, 162. An electrical continuity test was performed on several differently shaped structures, as shown in FIG. 16. No metal shorts were found and the structure failed only after the first insulating silicon dioxide layer 142 breakdown occured at about 25 volts. A curve tracer photograph is shown in FIG. 17.

A free standing sidewall stud structure has been fabricated. During reactive ion etching and polycrystalline silicon etching of the sidewall 145, the underlying epitaxial layer 140 is not attacked due to the presence of an $SiO_2$ film 142 in all areas. The stud height was 1.1 $\mu$m and the width has been 0.8 $\mu$m.

Further it has been demonstrated that selective exposure and removal of the metal 150 over the stud 145 areas can be achieved to obtain separation of metal lines. The metal line widths can be reduced by 1.6 $\mu$m from nominal value (3 $\mu$m to 1.4 $\mu$m). In addition, complete metal coverage is obtained in all contact areas. All metal images were retained independently of their size after "peak" metal etch.

While the invention has been particularly shown and described with reference to the preferred embodiments thereof, it will be understood by those skilled in the art that various changes in the form and details may be made therein without departing from the spirit and scope of the invention.

We claim:

1. A method for forming integrated circuits having a pattern of narrow dimensioned dielectric regions on a monocrystalline suitably doped semiconductor body which separates portions of the conductive layer making the first level contacts to said body comprising:
   providing said semiconductor body;
   forming a first insulating layer on a major surface of said body;
   forming on said layer a polycrystalline silicon layer;
   forming openings in said polycrystalline silicon layer by reactive ion etching which results in the structure having substantially horizontal surfaces and substantially vertical surfaces;
   forming a second insulating layer on both said substantially horizontal surfaces and said substantially vertical surfaces;
   reactive ion etching said second insulating layer to substantially remove said second insulating layer from said horizontal surfaces and to provide said narrow dimensioned dielectric regions on said semiconductor body;
   removing the said polycrystalline silicon layer by etching to leave said narrow dimensioned regions on said semiconductor body; and
   forming a conductive layer on said semiconductor body which has portions thereof electrically separated by said narrow dimensioned regions for contacting in self-alignment regions of said integrated circuits; wherein the said forming a conductive layer includes depositing a blanket layer of conductive material having a thickness of at least about that of the height of the narrow dimensioned regions over said narrow dimensioned regions and areas in between, blanket depositing a plastic material over the said conductive layer to planarize the surface, reactive ion etching the said plastic material and said conductive layer until the tops of said narrow dimensioned regions are reached and removing the remaining said plastic material to thereby form said portions of the conductive layer separated by said narrow dimensioned regions.

2. The method of claim 1 wherein portions of said first insulating layer are removed between certain of said narrow dimensioned regions by etching to expose said semiconductor body after the said removal of said second insulating layer from said horizontal surfaces has been accomplished and forming PN junctions in said silicon body between said certain of said narrow dimensioned regions whereby the subsequent said forming of conductive layer on said semiconductor body makes ohmic contact to said PN junctions.

3. The method of claim 2 wherein the said PN junctions are the emitters of transistors.

4. The method of claim 2 wherein the said PN junctions are elements of field effect transistors.

5. The method of claim 1 wherein portions of said first insulating layer are removed between certain of said narrow dielectric regions by etching to expose said semiconductor body after the removal of said second insulating layer from said horizontal surfaces has been accomplished and forming contact regions in said semiconductor body between said certain of said narrow dielectric regions whereby the subsequent said forming a conductive layer on said semiconductor body makes an ohmic contact to said contact regions.

6. The method of claim 5 wherein said contact regions are N+ and are the collector contacts for an NPN transistor.

7. The method of claim 5 wherein said contact regions are P+ and two such P+ regions are associated with one another to form the contacts to a P resistor.

8. The method of claim 1 wherein portions of said first insulating layer are removed between certain of said narrow dielectric regions by etching to expose said semiconductor body after removal of said second insulating layer from said horizontal surfaces has been accomplished whereby the subsequent said forming a conductive layer on said semiconductor body forms Schottky barrier contacts to said semiconductor body.

9. The method of claim 1 wherein said polycrystalline silicon layer is undoped.

10. The method of claim 1 wherein the said plastic material is a polyimide and said conductive layer is aluminum.

11. The method of claim 1 wherein the said removing step is accomplished by an oxygen ashing process.

12. The method of claim 1 wherein the narrowest width dimension of said narrow dimensioned regions is less than about 1.5 micrometers.

13. The method of claim 1 wherein the said narrow dimensioned regions are composed of silicon dioxide.

14. The method of claim 1 wherein said narrow dimensioned regions are composed of silicon dioxide, silicon nitride and polycrystalline silicon.

15. The method of claim 1 wherein said second insulating layer is composed of polycrystalline silicon on top of a layer of silicon nitride and subsequent to the said reactive ion etching of said second insulating layer the said narrow dimensioned regions are thermally oxidized to convert at least part of said polycrystalline silicon to a composite structure of silicon dioxide, silicon nitride and polycrystalline silicon.

16. A method for forming bipolar integrated circuits having a pattern of narrow dimensioned dielectric regions on a monocrystalline suitably doped silicon body which separates portions of the conductive layer making the first level contacts to said body comprising:

providing a monocrystalline silicon body having regions of dielectric separating surface regions of said monocrystalline silicon from one another;

said surface regions containing a surface base region and a subcollector region associated therewith;

forming a first insulating layer on the surface of said monocrystalline silicon body having said surface regions;

forming on said first insulating layer a polycrystalline silicon layer;

forming opening in said polycrystalline silicon layer by reaction ion etching which results in the structure having substantially horizontal surfaces and substantially vertical surfaces;

said openings are at least located at the locations above which the emitter and collector contact regions are to be formed in said surface regions;

forming a second insulating layer on both said substantially horizontal surfaces and said substantially vertical surfaces;

reactive ion etching said second insulating layer to substantially remove said second insulating layer from said horizontal surfaces and to provide said narrow dimensioned dielectric regions on said silicon body;

forming said emitter and collector contact regions through the said openings in said polycrystalline silicon layer;

removing said polycrystalline layer by etching to leave said narrow dimensioned regions on said silicon body;

forming contact openings in said first insulating layer to said emitter, base and collector contact regions; and forming a conductive layer on said silicon body which has portions thereof contacting said emitter, base and collector contact regions on the said surface of said silicon body and electrically separated by said narrow dimension regions; wherein the said forming a conductive layer includes depositing a blanket layer of conductive material having a thickness of at least about that of the height of the narrow dimensioned regions over said narrow dimensioned regions and areas in between, blanket depositing a plastic material over the said conductive layer to planarize the surface, reactive ion etching the said plastic material and said conductive layer until the tops of said narrow dimensioned regions are reached and removing the remaining said plastic material to thereby form portions of the said conductive layer separated by said narrow dimensioned regions.

17. The method of claim 16 wherein the emitter and collector contact regions are N+ for NPN transistors and are formed by ion implantation through a screen insulator layer.

18. The method of claim 16 wherein other of said openings in said polycrystalline silicon layer are formed at locations where Schottky barrier devices are to be formed, protecting such locations during said forming said emitter and collector contact step and forming openings in said first insulating layer at said locations where Schottky barrier devices are to be formed whereby the subsequent said forming a conductive layer on said silicon body forms Schottky barrier contacts to said silicon body.

19. The method of claim 16 wherein the said narrow dimensioned regions are composed of silicon dioxide and their narrowest width dimension is less that about 1.5 micrometers.

20. A method for forming integrated circuits having a pattern of narrow dimensioned dielectric regions on a suitably doped semiconductor body comprising:

providing a semiconductor body;

forming a first insulating layer on a major surface of said body;

forming on said layer a first polycrystalline silicon layer;

forming openings in said first polycrystalline silicon layer by reactive ion etching which results in the structure having substantially horizontal surfaces and substantially vertical surfaces;

forming a layer of silicon nitride over said substantially horizontal and vertical surfaces;

forming a second layer of polycrystalline silicon over said silicon nitride layer on said substantially horizontal and vertical surfaces;

reactive ion etching said second layer of polycrystalline silicon to substantially remove said second layer from said horizontal surfaces;

thermally oxidizing the remaining said second layer to provide said narrow dimensioned dielectric regions on said silicon body;

removing said first polycrystalline layer by etching to leave said narrow dimensioned regions on said silicon body;

forming contact openings to said semiconductor body through said first insulating layer; and forming a conductive layer on said semiconductor body which has portions thereof electrically separated by said narrow dimensioned regions for contacting the said integrated circuit through said contact openings.

21. The method of claim 20 wherein portions of said first insulating layer are removed between certain of said narrow dimensioned regions by etching to expose said silicon body after said oxidizing of the remaining said second layer of polycrystalline silicon step and forming PN junction devices in said semiconductor body between said certain of said narrow dimensioned regions whereby the subsequent said forming a conductive layer on said semiconductor body makes ohmic contact to said PN junction devices.

22. The method of claim 21 wherein the said PN junction devices are the emitters of transistors.

23. The method of claim 21 wherein the said PN junction devices are elements of field effect transistors.

24. The method of claim 20 wherein the exposed first polycrystalline silicon surfaces are oxidized to a silicon dioxide layer prior to the step of said forming a layer of silicon nitride.

25. The method of claim 24 wherein the said narrow dimensioned dielectric regions are composed of silicon dioxide, silicon nitride and polycrystalline silicon and are in their narrowest dimension less than about 1.2 micrometers.

26. The method of claim 20 wherein the said forming a conductive layer includes depositing a blanket layer of aluminum over said narrow dimensioned regions and areas in between blanket, depositing a plastic material over the said aluminum layer to planarize the surface, reactive ion etching the said plastic material and said aluminum layer until the tops of said narrow dimensioned regions are reached and removing the remaining said plastic material.

27. The method of claim 26 wherein said plastic material is a polyimide and the said plastic material is removed by oxygen ashing.

28. The method of claim 20 wherein the said forming a conductive layer includes depositing a blanket layer of aluminum over said narrow dimensioned regions and areas in between, blanket depositing a plastic material over the said aluminum layer to planarize the surface, reactive ion etching the said plastic material until the peaks of said aluminum covering said narrow dimensioned regions are reached, removing said peaks of metal by etching down to said narrow dimensioned regions and removing the remaining said plastic material to thereby form said conductive layer.

29. The method of claim 20 wherein the said conductive layer is composed of doped polycrystalline silicon.

30. A method for forming bipolar integrated circuits having a pattern of narrow dimensioned dielectric regions on a monocrystalline suitably doped silicon body comprising:
    providing a monocrystalline silicon body having region of dielectric separating surface regions of said monocrystalline silicon from one another;
    said surface regions containing a surface base region of a subcollector region associated therewith;
    forming a first insulating layer on the surface of said monocrystalline silicon body having said surface regions;
    forming on said first insulating layer a first layer of polycrystalline silicon;
    forming openings in said first polycrystalline silicon layer by reactive ion etching which results in the structure having substantially horizontal surfaces and substantially vertical surface;
    said openings are at least located at the locations above which the emitter and collector contact regions are to be formed in said surface regions;
    thermally oxidizing the exposed polycrystalline silicon surfaces to form a silicon dioxide layer thereon;
    forming a layer of silicon nitride over said silicon dioxide layer and said substantially horizontal and vertical surfaces;
    forming a second layer of polycrystalline silicon over said silicon nitride layer on said substantially horizontal and vertical surfaces;
    reactive ion etching said second layer of polycrystalline silicon to substantially remove said second layer from said horizontal surfaces;
    thermally oxidizing the remaining said second layer to provide said narrow dimensioned dielectric regions on said silicon body;
    forming said emitter and collector contact regions through the said openings in said polycrystalline silicon layer;
    removing said first polycrystalline layer by etching to leave said narrow dielectric regions on said silicon body;
    forming contact openings in said first insulating layer to said emitter, base and collector contact regions; and
    forming a conductive layer on said silicon body which has portions thereof contacting said emitter, base and collector contact regions on the said surface of said silicon body and electrically separated by said narrow dimensioned regions.

31. The method of claim 30 wherein the emitter and collector contact regions are N+ for NPN transistors and are formed by an ion implantation process through a screen insulator layer.

32. The method of claim 30 wherein others of said openings in said polycrystalline silicond layer are formed at locations where Schottky barrier devices are to be formed, protecting such locations during said forming said emitter and collector contact step and forming openings in said first insulating layer at said locations where Schottky barrier devices are to be formed whereby the subsequent said forming a conductive layer on said silicon body forms Schottky barrier contacts to said silicon body.

33. The method of claim 30 werein resistors are provided in said integrated circuit.

34. The method of claim 33 wherein said resistors are P type with two P+ contact regions formed in said silicon body for contacting said P type resistors.

35. The method of claims 31, 32 or 33 wherein said NPN transistors, Schottky barrier devices and resistors are so arranged and interconnected by said conductive layer to form Schottky coupled memory cells in said integrated circuit.

36. The method for forming bipolar integrated circuits having a pattern of narrow dimensioned dielectric regions on a monocrystalline suitably doped silicon body comprising:
    providing a monocrystalline silicon body having regions of dielectric separating surface regions of said monocrystalline silicon from one another;
    said surface regions containing a surface base region and a subcollector region associated therewith;
    forming a first insulating layer on the surface of said monocrystalline silicon body having said surface regions;
    forming on said first insulating layer a polycrystalline silicon layer;
    forming openings in said polycrystalline silicon layer by reactive ion etching which results in the structure having substantially horizontal surfaces and substantially vertical surfaces;
    said openings are at least located at the locations above which base contacts are to be made to said base region and the designated emitter and collector contact regions for said bipolar integrated circuit remains covered with said polycrystalline silicon layer;
    forming a second insulating layer on both said substantially horizontal surfaces and said substantially vertical surfaces;
    reactive ion etching said second insulating layer to substantially remove said second insulating layer from said horizontal surfaces and to provide said narrow dimensioned dielectric regions on said silicon body;
    removing said polycrystalline layer by etching to leave said narrow dimensioned regions on said silicon body;
    forming the said emitter regions in the said surface regions of said silicon body;
    forming contact openings in said first insulating layer to said emitter, base and collector contact regions; and
    forming a conductive layer on said silicon body which has portions thereof contacting said emitter, base and collector contact regions on the said surface of said silicon body and electrically separated by said narrow dimensioned regions.

37. The method of claim 36 wherein the narrowest surface dimension of said emitter regions are less than about 2.5 micrometers and the narrowest width dimension of said narrow dimensioned regions is less than about 0.8 micrometers.

38. The method of claim 37 wherein said narrow dimensioned regions are composed of silicon dioxide.

39. The method of claim 37 wherein said narrow dimensioned regions are composed of a combination of insulator materials.

40. The method of claim 37 wherein said narrow dimensioned regions are composed of silicon dioxide, silicon nitride and polycrystalline silicon.

41. The method of claim 36 wherein the said forming a conductive layer includes depositing a blanket layer of aluminum over said narrow dimensioned regions and areas in between, blanket depositing a plastic material over the same aluminum layer to planarize the surface, reactive ion etching the said plastic material and said aluminum layer until the tops of said narrow dimensioned regions are reached and removing the remaining said material.

42. The method of claim 36 wherein the said forming a conductive layer includes depositing a blanket layer of aluminum over said narrow dimensioned regions and areas in between, blanket depositing a plastic material over the said aluminum layer to planarize the surface, reactive ion etching the said plastic material until the peaks of said aluminum covering said narrow dimensioned regions are reached, removing said peaks of metal by etching down to said narrow dimensioned regions and removing the remaining said plastic material to thereby form said conductive layer.

43. The method of claim 36 wherein the said surface base regions are separated by said dielectric from the associated said collector contact regions and certain of said narrow dimensioned regions bridge across the width of said base regions.

* * * * *